US010343159B2

(12) United States Patent
Owens et al.

(10) Patent No.: US 10,343,159 B2
(45) Date of Patent: Jul. 9, 2019

(54) SYSTEMS, DEVICES, AND METHODS FOR MICROFLUIDICS USING MODULAR BLOCKS

(71) Applicant: Massachusetts Institute of Technology, Cambridge, MA (US)

(72) Inventors: Crystal Elaine Owens, West Des Moines, IA (US); Anastasios John Hart, Waban, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 212 days.

(21) Appl. No.: 15/475,119

(22) Filed: Mar. 30, 2017

(65) Prior Publication Data

US 2018/0078936 A1 Mar. 22, 2018

Related U.S. Application Data

(60) Provisional application No. 62/395,609, filed on Sep. 16, 2016.

(51) Int. Cl.

| | |
|---|---|
| ***B01L 3/00*** | (2006.01) |
| ***B81B 1/00*** | (2006.01) |
| *B29C 65/00* | (2006.01) |

(52) U.S. Cl.

CPC ... *B01L 3/502707* (2013.01); *B01L 3/502715* (2013.01); *B01L 2200/025* (2013.01);

(Continued)

(58) Field of Classification Search

CPC ......... B01L 2200/025; B01L 2200/028; B01L 2200/0689; B01L 2200/10; B01L 2200/12; B01L 2300/0654; B01L 2300/0663; B01L 2300/0816; B01L 2300/0858; B01L 2300/0874; B01L 2300/123;

(Continued)

(56) References Cited

U.S. PATENT DOCUMENTS

2010/0258211 A1* 10/2010 Burns .................. B01J 19/0093 137/833

OTHER PUBLICATIONS

[No Author Listed] Slow Sand Filter, Wikipedia entry; last edited Jun. 27, 2018, accessed Jul. 3, 2018, <https://https://en.wikipedia.org/wiki/Slow_sand_filter>.

(Continued)

*Primary Examiner* — Jennifer Wecker
(74) *Attorney, Agent, or Firm* — Nutter McClennen & Fish LLP

(57) ABSTRACT

The present disclosure is directed to the creation and/or manipulation of microfluidic systems and methods that can be formed in pre-existing modular blocks. Microfluidic paths can be formed in one or more blocks, and when multiple blocks are used, the blocks can be used together to form a path across the blocks. The paths can be sealed to prevent fluid leakage. The modular blocks can be readily available blocks which can then be individually customized to achieve various microfluidic design goals. The paths can be formed in outer surfaces of the blocks and/or disposed through a volume of the blocks. The modular blocks can have a uniform design across various block types, making it easy to reconfigure systems and/or remove and replace blocks and other components of the system. Methods for constructing such systems, and using such systems, are also provided.

35 Claims, 24 Drawing Sheets

(52) U.S. Cl.
CPC . *B01L 2200/028* (2013.01); *B01L 2200/0689* (2013.01); *B01L 2200/10* (2013.01); *B01L 2200/12* (2013.01); *B01L 2300/0654* (2013.01); *B01L 2300/0663* (2013.01); *B01L 2300/0816* (2013.01); *B01L 2300/0858* (2013.01); *B01L 2300/0874* (2013.01); *B01L 2300/123* (2013.01); *B01L 2300/1822* (2013.01); *B01L 2300/1827* (2013.01); *B01L 2400/0406* (2013.01); *B01L 2400/0487* (2013.01)

(58) Field of Classification Search
CPC ..... B01L 2300/1822; B01L 2300/1827; B01L 2400/0406; B01L 2400/0487; B01L 3/502707; B01L 3/502715
See application file for complete search history.

(56) References Cited

OTHER PUBLICATIONS

Au, A. K., Lee, W. & Folch, A. Mail-order microfluidics: evaluation of stereolithography forthe production ofmicrofluidic devices. Lab Chip 14, 1294-301 (2014).
Au, AK., Bhattacharjee, N., Horowitz, L. F., Chang, T. C. & Folch, a 3D-printed microfluidic automation. Lab Chip 15, 1934-41 (2015).
Bhargava, K. C., Thompson, B. & Malmstadt, N. Discrete elements for 3D microfluidics. Proc. Natl. Acad Sci. U.S.A., v. 111, 15013-8 (2014).
Carrilho, E., Martinez, A. W. & Whitesides, G. M. Wax Printing—a Simple Micropatterning Process for Paper-based Microfluidics, Anal. Chem., 81, 7091-7095 (2009).
Coltro, W. K. T., De Jesus, D. P., Da Silva, J. A. F., Do Lago, C. L. & Carrilho, E. Toner and paper-based fabrication techniques for microfluidic applications. Electrophoresis 31, 2487-2498 (2010).
Garstecki, P. & Whitesides, G. M. Formation of bubbles and droplets in microfluidic systems; Bulletin of the Polish Academy of Sciences, 53, pp. 361-372 (2005).
Guckenberger, D. J. et al., Micromilling: A method for ultra-rapid prototyping of plastic microfluidic devices. Lab Chip 15, 2364-2378 (2015).
Guckenberger, D. J., et al, Micromilling: A method for ultra-rapid prototyping of plastic microfluidic devices, (Suppl. Information), Lab Chip; 2015, pp. 1-13.
Iwai, K. et al. Finger-powered microfluidic systems using multilayer soft lithography and injection molding processes. Lab Chip 14, 3790-9 (2014).
Konda, A, Taylor, J.M., Stoller, M. A & Morin, S. A Reconfigurable microfluidic systems with reversible seals compatible with 2D and 3D surfaces of arbitrary chemical composition. Lab Chip 15, 2009-2017 (2015).
Lee, K. G. et al. 3D printed modules for integrated microfluidic devices. RSC Adv. 4, 32876 (2014).
Martinez, A. W., Phillips, S. T. & Whitesides, G. M. Diagnostics for the Developing World: Microfluidic Paper-Based Analytical Devices, Anal. Chem., v. 82, 3-10 (2010).
Morgan, A. J. L. et al. Simple and Versatile 3D Printed Microfluidics Using Fused Filament Fabrication, PLOS One, 1-17 (Apr. 6, 2016). doi: 10.1371/journal.pone.0152023.
Mueller, S., Mohr, T., Guenther, K., Frohnhofen, J. & Baudisch, P. faBrickation: Fast 3D Printing of Functional Objects by Integrating Construction Kit Building Blocks, CHI2014, One of a CHInd, Apr. 26-May 1, 2014 Toronto, Ontario, CA (ACM) 3827-3834.
Oliver, C.R. et al. On-Demand Isolation and Manipulation of C. elegans by In Vitro Maskless Photopatterning. PLoS One 11, e0145935 (2016).
O'Neill, P. F. et al. Advances in three-dimensional rapid prototyping of microfluidic devices for biological applications. Biomicrofluidics 8, 052112 (2014).
Owens, C., "Modular LEGO Brick Microfluidics," Feb. 2017, Masters Thesis, Massachusetts Institute of Technology (102 pages).
Sackmann, E. K., Fulton, AL. & Beebe, D. J. The present and future role of microfluidics in biomedical research. Nature 507, 181-9 (2014).
Salgado, G. "Barriers to the Diffusion of Microfluidics from Research to Market." (Dissertation) (Catolica Lisbon, Mar. 23, 2016) 79 pages.
Slocum, A.H. & Weber, A. C. Precision passive mechanical alignment of wafers. J. Microelectromechanical Syst. 12, 826-834 (2003).
Sochol, R. D. et al. 3D Printed Microfluidic Circuitry via Multijet-Based Additive Manufacturing. Lab Chip Feb. 21, 2016, v16, pp. 668-678.
Stormonth-Darling, J.M. & Gadegaard, N. Injection moulding difficult nanopatterns with hybrid polymer inlays. Macromol. Mater. Eng. 297, 1075-1080 (2012).
Thompson, B. L. et al. Inexpensive, rapid prototyping of microfluidic devices using overhead transparencies and a laser print, cut and laminate fabrication method. Nat. Protoc. 10, 875-86 (2015).
Tsuda, S. et al. Customizable 3D Printed 'Plug and Play' Millifluidic Devices for Programmable Fluidics. PLoS One 10, e0141640-1-13<https://doi.org/10.1371/journal.pone.0141640 >.
Weigl, B., Domingo, G., Labarre, P. & Gerlach, J. Towards non- and minimally instrumented, microfluidics-based diagnostic devices. Lab Chip 8, 1999-2014 (2008).
Whitesides, G. M. The origins and the future of microfluidics. Nature 442, 368-73 (2006).
Xia, Y. & Whitesides, G. M. Soft Lithography. Annu. Rev. Mater. Sci. 28, 153-184 (1998).
Xu, H., "LEGO Microfluidics Systems for Educational Use," under direction of Prof. John Hart, Research Science Institute (RSI); slide presentation; Aug. 5, 2016.
Yadav, S. "Analysis of value creation and value capture in microfluidics market," Massachusetts Institute of Technology, MS Thesis, Jan. 14, 2010, 78 pages.

* cited by examiner

SYSTEMS, DEVICES, AND METHODS FOR MICROFLUIDICS USING MODULAR BLOCKS

CROSS REFERENCE TO RELATED APPLICATION

The present disclosure claims priority to U.S. Provisional Application No. 62/395,609, entitled "Modular Functional Block System," which was filed on Sep. 16, 2016, and which is incorporated by reference herein in its entirety.

GOVERNMENT RIGHTS

This invention was made with Government support under Grant No. SMA-1122374 awarded by the National Science Foundation. The Government has certain rights in the invention.

FIELD

The present disclosure relates to systems, devices, and methods for creating microfluidic systems, and more particularly relates to creating customized microfluidic systems in existing, standardized components, such as consistently created modular blocks.

BACKGROUND

Microfluidic technology provides unique tools to perform biological analysis and chemical synthesis with precise control of concentrations, and tools to understand reaction products and investigate the fundamental science of transport at sub-micron scales. However, unlike customizable system technologies such as circuit electronics that can be designed and used with relatively accessible tools and uniform production infrastructure, microfluidics requires stringent manufacturing tolerances and faces practical issues (e.g., material restrictions, tight sealing). As microfluidic systems are being built and tested, it can be useful to be able to easily change the set-up of such a system without creating delays while manufacturing individual pieces for use as part of the system. Likewise, it can be beneficial for systems to be adaptable such that various components that measure different parameters can be quickly swapped in and out of the system, or combined as part of a single system, to expedite the analyses performed by the systems. Moreover, it can be beneficial to integrate sensors and actuators, e.g., optical probes and valves, in close proximity to a fluid path in order to perform more accurate analyses.

Numerous specialized and complex methods for fabrication have evolved for microfluidics systems, many of which can be developed only by highly skilled works in well-funded laboratories. Indeed, the commercial viability of many lab-on-a-chip diagnostic tools has been limited by the high capital cost of manufacturing the devices, especially at the minute (typically micrometer-scale) dimensional tolerances required. Further, even as manufacturing techniques for creating microfluidics systems evolve, existing techniques are typically best suited for small volume production. While it can often be desirable to have a microfluidic system that can be rapidly adjusted on the fly, this can be difficult to do while still maintaining accuracy and preventing incidents (e.g., leaking).

One manufacturing technique that has gained some traction in the microfluidic space is three-dimensional printing (e.g., additive manufacturing) because of its generally customizable nature. These techniques have led to modular system development, but typically only for small-scale production. This is at least because of the many limitations that can exist in three-dimensionally printed systems, such as: choice of materials, dimensional resolution including minimum feature size and surface roughness, and long-term dimensional stability (particularly when in contact with a fluid). Modularity places stringent requirements on accuracy, repeatability, interchangeability—essential criteria to enable rapid construction of systems from a component library, and for maintenance of tight seals between modules, particularly if the system is reconfigurable. Other known manufacturing techniques, such as injection-molding, are not preferred because of the high tooling costs for producing a large number of identical units.

Accordingly, there is a need to be able to create microfluidic systems at a high volume while still meeting the stringent requirements related to manufacturing tolerances and the like so that the systems may perform accurately and without incident (e.g., leaking). There is a further need to be able to allow for microfluidic systems to be highly customizable and reconfigurable even when at least portions of the systems are mass-produced. Improved methods for forming a microfluidic path, and for passing a fluid through a microfluidic path, are also desired.

SUMMARY

The present disclosure generally provides for microfluidic systems that can be formed from modular blocks. The modular blocks can come in many different forms. For example, in some instances the blocks can be pre-existing blocks that can be acquired (e.g., purchased, stolen, etc.) and modified to create a microfluidic path in one or more of the blocks. When multiple blocks are required for a system, the path can extend across multiple blocks and/or one or more of the blocks can be configured to perform some function used in microfluidic systems (e.g., sensing, measuring, testing, sorting, etc.). Some non-limiting examples of pre-existing modular blocks that can be used to construct microfluidic systems, or perform methods related to the same, include: LEGO®, Wonder Bricks, Nanoblocks+®, Duplo®, K'Nex®, and Meccano® building blocks and other components. While such blocks and other components are mass-produced, a person skilled in the art will recognize that many different types, sizes, and shapes of blocks and other components already exist in pre-existing modular block systems, thus providing a first degree of customizability while still allowing for easy access to the base unit of the system. The pre-existing modular blocks can themselves be customized to include components of a microfluidic system, such as by forming a channel in the block to form a portion of a microfluidic path (or forming an entire path in a singular block in some instances) and/or adapting one or more blocks for use to perform some function used in microfluidic systems. When multiple blocks are used to form a microfluidic path across the blocks, the blocks can be situated with respect to each other to create a continuous path, with proper sealing used to prevent leaking of fluid passing through the path.

In other instances, the blocks may not be pre-existing modular blocks. Instead the blocks can be produced using any techniques known to those skilled in the art, including but not limited to injection molding or various types of three-dimensional printing, such as additive manufacturing. The blocks can first be formed and then have one or more channels formed in the blocks once the full block is constructured, or alternatively, the channels and/or other aspects of a microfluidic system can be formed as part of the block during the manufacturing process. Whether pre-fabricated or made right around the time the microfluidic components are constructed, the modular blocks can provide uniformity across a number of blocks so that they can be used consistently and repeatedly. For example, the blocks can include various precision locating features, such as protrusions, posts, and the related regular spacing that is provided between such protrusions and posts, and those features can help provide the uniformity across the system(s). Such uniformity also permits the easy reconfiguration and customization of a microfluidic system, since the components of the system can be easily plugged-and-played. In essence, the base configuration for the systems, e.g., the blocks, can be mass-produced and/or easily acquired, while the formation of the microfluidic aspects of the system (e.g., the channels), as well as the ability to reconfigure the overall design and function of the system, can be easily customized due to the uniformity of the base configuration.

In one exemplary embodiment, the microfluidic system includes a baseplate, a plurality of blocks, one or more channels formed in one or more blocks of the plurality of blocks, and one or more seals. The baseplate has a plurality of precision locating protrusions disposed on the baseplate, and the plurality of blocks have a plurality of sidewalls. The sidewalls are configured to be complementary to the plurality of precision locating protrusions of the baseplate such that the plurality of sidewalls of a block of the plurality of blocks engage the plurality of precision locating protrusions of the baseplate to set a location of the block with respect to the baseplate. The one channel(s) formed in a first block of the one or more blocks extends between a first passage of the first block and a second passage of the first block to form at least a portion of a microfluidic path. The seal(s) is disposed along the microfluidic path.

The plurality of precision locating protrusions of the baseplate can include a plurality of elastically averaged contacts, and likewise, the plurality of sidewalls can include one or more elastically averaged contacts that couples with the plurality of elastically averaged contacts of the baseplate via an elastic fit (or an interference fit). In some embodiments, the blocks can include one or more precision locating protrusions disposed on the blocks. The precision locating protrusions of the blocks can be configured to be complementary to the sidewalls of one or more blocks of the plurality of blocks such that a second block of the blocks can be coupled to the top surface of the first block, which itself is coupled to the baseplate, to set a location of the second block with respect to each of the first block and the baseplate. The precision locating protrusions of the baseplate and the sidewalls of the blocks can be configured to be reversibly coupled together such that a location that is set between the first block and the baseplate is changeable. Precision locating protrusions of blocks can likewise be configured to be reversibly coupled with sidewalls of other blocks.

In some embodiments, the first passage is disposed on a first side surface of the first block and the second passage is disposed on a second side surface of the first block, with the second side surface being opposed to the first side surface such that the microfluidic path extends from the first side surface to the second side surface. The microfluidic path can be substantially disposed along an outer surface of the first block. Alternatively, the microfluidic path can be substantially disposed through an internal volume of the first block. In some instances, portions of the path can be disposed along both an outer surface of the first block and through an internal volume of the first block.

At least one block of the plurality of blocks can include one or more precision locating posts. The post(s) can extend towards the mating surface of the at least one block, and the posts can be configured to be complementary to the precision locating protrusions of the baseplate such that coupling the post(s) of the block to the precision locating protrusions of the baseplate assists in setting a location of the block with respect to the baseplate.

In instances in which channels are formed in at least two blocks, such as the first block and a second block, the one or more seals can include each of a first seal and a second seal. The first seal can be disposed at the second passage of the first block and the second seal can be disposed at a first passage of the second block. As a result, the first and second seals can provide a sealed portion of the microfluidic path between the first and second blocks. In some embodiments, the channel(s) formed in the first block (and/or any other blocks) can be configured to hold fluid within the channel by surface tension when the first block is repositioned or reoriented with respect to the baseplate.

The blocks can be configured in many different ways. Thus, in some embodiments, at least one block of the plurality of blocks can be configured to perform a sensing function or an active function on fluid passing through the microfluidic path. Such a block(s) can include, for example, a block having at least one of a photodiode and a charge-coupled device associated with it. In other embodiments the block can have a magnet associated with it. In some embodiments, the first passage of the first block can be formed on a first outer wall of the first block and the second passage of the first block can be formed on a second outer wall of the first block, with the first and second outer walls being adjacent and substantially perpendicular to each other such that the portion of the microfluidic path extending between the two outer walls is formed in two, substantially perpendicular planes. By way of further example, in some embodiments the microfluidic path can include a first central portion having a spiral shape and a second outer portion having a plurality of terminal ends disposed after the spiral shape of the microfluidic path. The spiral shape and the terminal ends can be configured to sort fluid disposed in them based on one or more properties of the fluid. In still other embodiments, the plurality of blocks can include at least one block configured to receive a device configured to sense one or more parameters of a fluid passing through the microfluidic path.

The system can include an electrically conductive pathway that contacts one or more faces of the blocks. In some such embodiments, a printed circuit board can be electrically connected to the electrically conductive pathway. The system can include an electrically conductive pathway that contacts the microfluidic pathway in one or more locations. The system can include an electrically conductive pathway that can be placed so that it will be in physical contact with fluid inside a microfluidic path, for instance to sense one or more parameters of a fluid passing through a microfluidic path and/or to apply an electrical signal to the fluid.

One exemplary embodiment of a method for passing fluid through a microfluidic path includes attaching a first block to a baseplate by coupling sidewalls of the first block to a plurality of precision locating protrusions disposed on the baseplate, and also attaching a second block to at least one of the baseplate or the first block. The first block has one or more channels formed in it, with the channel(s) extending between a first passage and a second passage. The second block is configured to do at least one of the following: (1)

form an additional portion of a microfluidic path that includes a path defined by the channel(s) of the first block, with the additional portion including one or more channels of the second block; and (2) perform a sensing function or an active function on fluid passing through the channel(s) of the first block. Fluid is placed into the channel(s) of the first block by inserting the fluid into the first passage. If the second block is configured to form an additional portion of a microfluidic path that includes a path defined by the one or more channels of the first block, the method includes allowing the fluid to pass from the second passage of the first block to a first passage of the second block such that the fluid enters the channel(s) of the second block. If the second block is configured to perform a sensing function or an active function on fluid passing through the channel(s) of the first block, the method includes performing the sensing function or active function on the fluid placed into the channel(s) of the first block.

The method can include selectively attaching at least one of: (1) the second block if it forms an additional portion of a microfluidic path that includes a path defined by the channel(s) of the first block; and (2) one or more additional blocks to form a sealed microfluidic path between the first block and the selectively attached other blocks (e.g., the second block and/or the one or more additional blocks). Accordingly, placing fluid into the channel(s) of the first block results in the fluid passing into at least one of the selectively attached other blocks. In some such embodiments, the method can include moving at last one of the first block, the second block, and the one or more additional blocks after initial placement to change at least one of: (1) a configuration of the microfluidic path; and (2) a location of the second block and the one or more additional blocks that is configured to perform a sensing function or active function on the fluid placed into the channel(s) of the first block.

In some embodiments, a third block can be attached to a top surface of at least one of the first block and the second block by coupling sidewalls of the third block to a plurality of precision locating protrusions disposed on a top surface of the first and/or second blocks. The third block can be configured to do at least one of the following: (1) form an additional portion of the microfluidic path that includes the path defined by the channel(s) of the first block, the additional portion including one or more channels of the third block; and (2) perform a sensing function or an active function on fluid passing through the microfluidic path.

The method can include forming the channel(s) of the first block (and/or additional blocks). In some instances, forming the channel(s) of the first block can include forming at least a substantial portion of the channel(s) in an outer surface of the first block. Alternatively, forming the channel(s) of the first block can include forming at least a substantial portion of the channel(s) in an internal volume of the first block. In some instances, the method can include forming portions of the path along both an outer surface and through an internal volume of the first block.

In some embodiments, the second block includes a magnet. In such instances the method can include operating the magnet to control a flow of the fluid through the microfluidic path. In some embodiments the channel(s) formed in the first block can be formed in both a first outer wall and a second outer wall of the first block, with the first and second outer walls being adjacent and substantially perpendicular to each other. As a result, fluid passing through the path can be advectively mixed when it passes between substantially non-parallel faces. In some alternative embodiments, the channel(s) of the first block can have a spiral shape with a plurality of terminal ends. In such embodiments, the step of placing fluid into the channel(s) of the first block by inserting the fluid into the first passage can include allowing the fluid inserted into the first passage to sort by dispersing to different portions of the channel(s) based on one or more properties of the fluid. In some embodiments, the channel(s) of the first block can have a plurality of passages (e.g., inlet apertures) with fluid paths that converge to a point with a junction geometry such as a "T" junction, which can cause one of the two distinct fluids to separate into droplets.

The method can also include applying voltage to an electrically conductive pathway that contacts one or more faces of the first block.

One exemplary method for forming a microfluidic path includes forming one or more channels in a block having a plurality of sidewalls. The channel(s) are formed in one or more outer faces of the block to create a microfluidic path in which fluid can be disposed. The method further includes coupling a cover to one or more of the outer faces in which the channel(s) are formed to cover the channel(s). The cover is configured to maintain a location of fluid disposed in the channel(s) when the block is freely moved.

The block can be made by at least one of a molding process and a casting process, while the one or more channels can be made by at least one of a machining process and an additive manufacturing process onto a surface of the molded or casted block. In some embodiments, a seal can be disposed on at least at one of a first passage and a second passage of the portion of the microfluidic path formed in the block. In instances in which the seal is disposed at the second passage, the method can include forming one or more channels in a second block having a plurality of sidewalls. The microchannel(s) can be formed in one or more outer faces of the second block and to create a further portion of the microfluidic path in which fluid can be disposed. In such instances the method can further include disposing a seal at a first passage of the portion of the microfluidic path formed in the second block. The first passage of the second block can be configured to be directly adjacent to the second passage of the block to keep the microfluidic path sealed between the block and the second block.

The block can include one or more precision locating protrusions disposed on the block. In some embodiments, the block can also include one or more precision locating posts that extend towards a bottom surface of the block. The post(s) can extend in a direction opposite to a direction in which the precision locating protrusion(s) extend.

The forming channel(s) in a block step can include forming a portion of at least one channel of the one or more channels in a first outer face of the one or more outer faces, and forming a further portion of the least one channel of the one or more microchannels in a second outer face of the one or more outer faces. The first and second outer faces can be adjacent and substantially perpendicular to each other such that the channel(s) formed by the two portions in the first and second outer faces is formed in two, substantially perpendicular planes. Alternatively, the forming channel(s) in a block step can include forming a spiral shape in a central portion of an outer face of the one or more outer faces to form at least a portion of the microfluidic path, and forming a plurality of terminal ends each in fluid communication with the central portion of the spiral shape as part of the microfluidic path. The resulting configuration of the microfluidic path can be configured to sort fluid disposed in the microfluidic path based on one or more properties of the fluid. In some embodiments, forming one or more channels in a block having a plurality of sidewalls can include forming a portion of the microfluidic path near an edge between two outer faces that are adjacent and substantially perpendicular to each other such that the microfluidic path passes between the two faces multiple times along the microfluidic path. Such a configuration can be effective to perform advective mixing when the fluid passes between substantially non-parallel faces.

BRIEF DESCRIPTION OF DRAWINGS

This disclosure will be more fully understood from the following detailed description taken in conjunction with the accompanying drawings, in which.

Figure 4A:
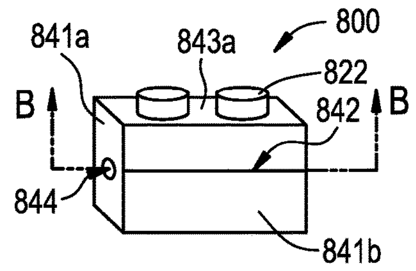
FIG. 4A is a perspective view of another exemplary embodiment of a modular block, the modular block having a channel formed in an outer surface of the block.
Figure 4C:
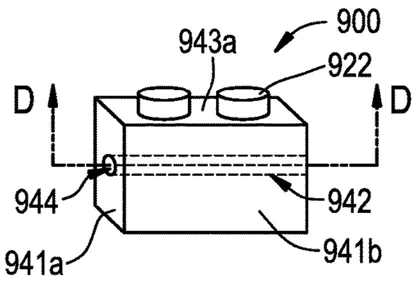
FIG. 4C is a perspective view of yet another exemplary embodiment of a modular block, the modular block having a channel formed through a volume of the block.
Figure 5A:
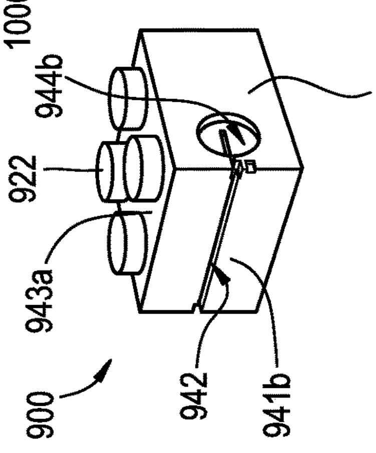
Figure 5C:
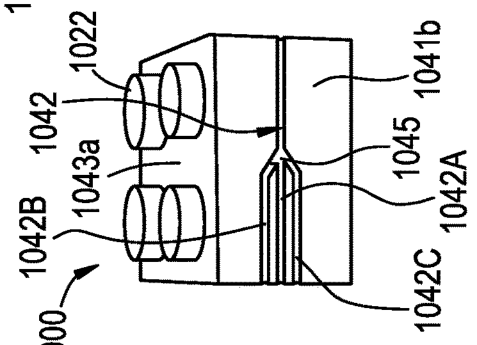
Figure 5E:
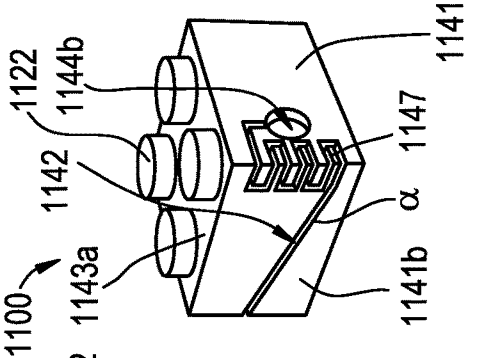
Figure 5G:
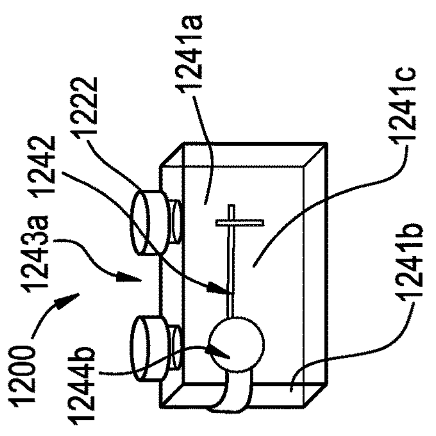
Figure 5B:
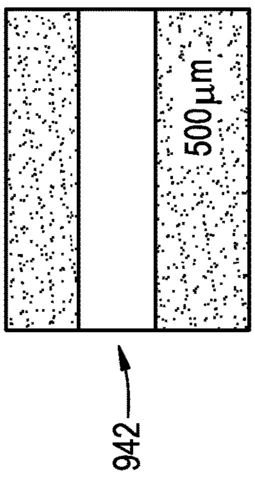
Figure 5D:
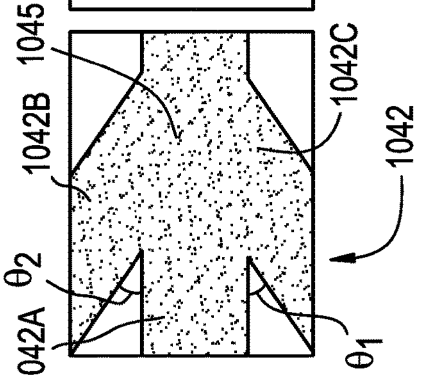
Figure 5F:
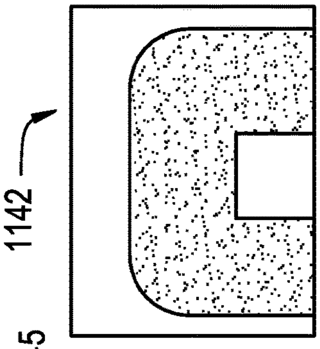
Figure 5H:
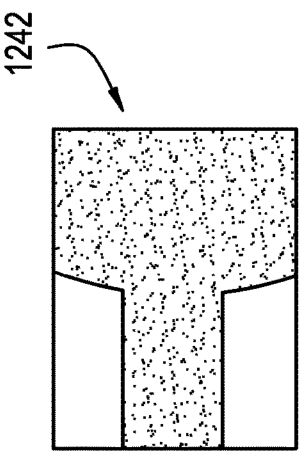
Figure 6A:
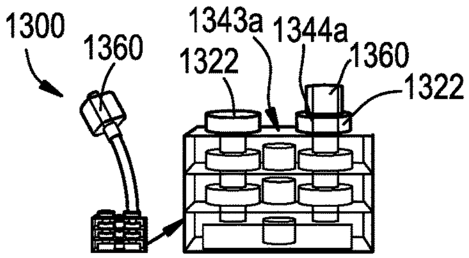
Figure 6B:
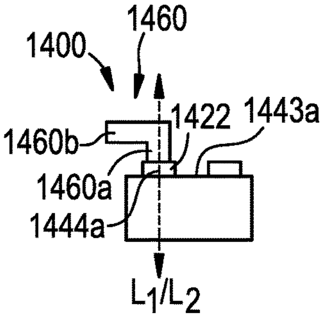
Figure 6C:
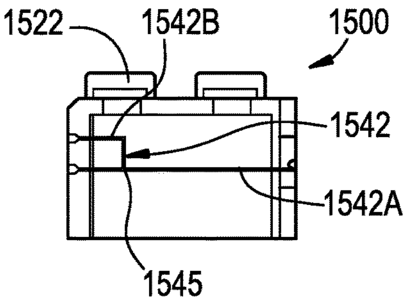
Figure 6D:
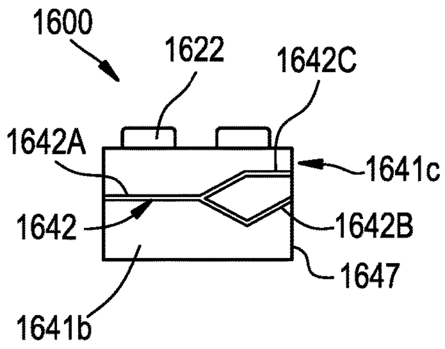
Figure 6E:
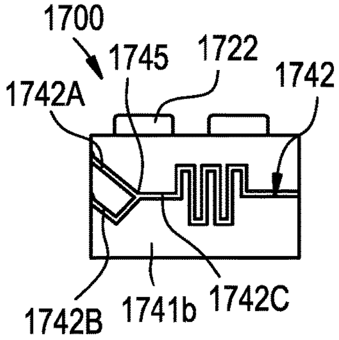
Figure 6F:
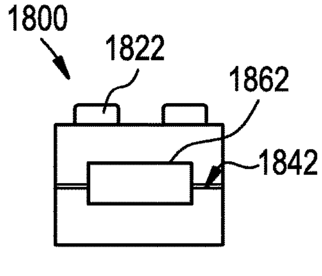
Figure 6G:
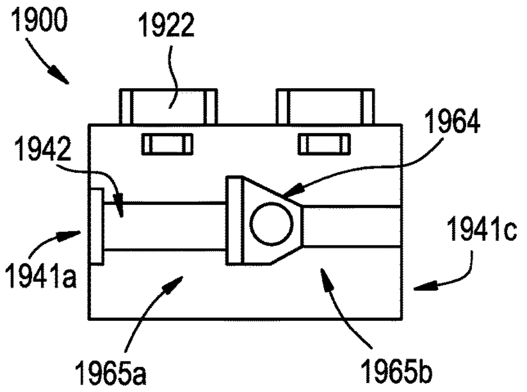
Figure 6H:
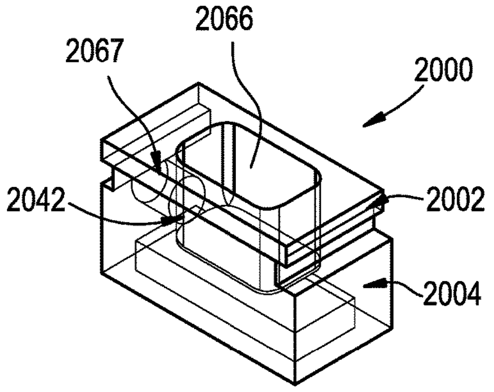
Figure 6I:
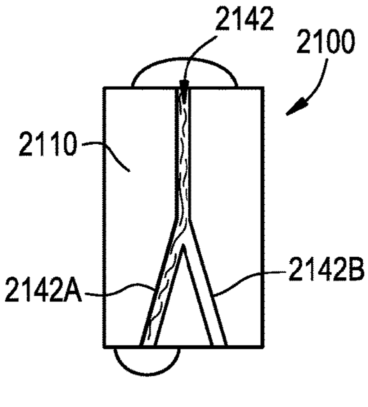
Figure 6J:
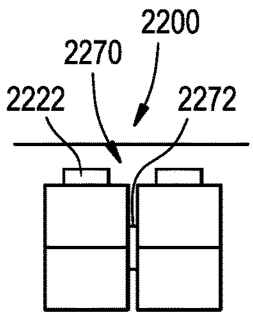
Figure 6K:
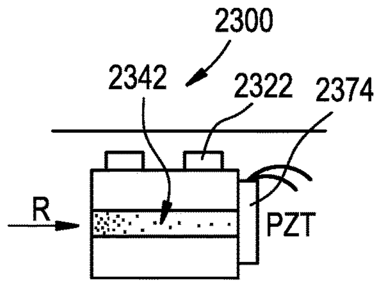
Figure 6L:
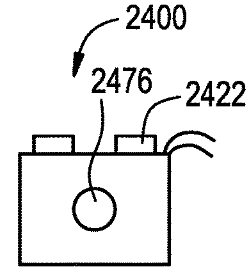
Figure 6M:
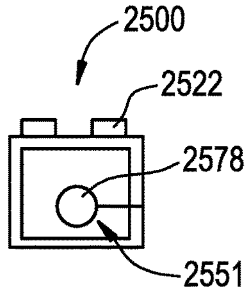
Figure 6N:
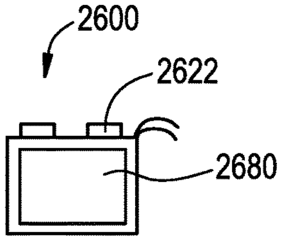
Figure 6O:
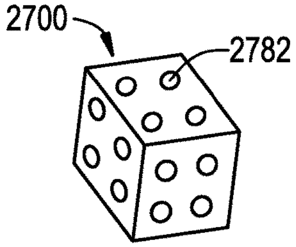
Figure 6P:
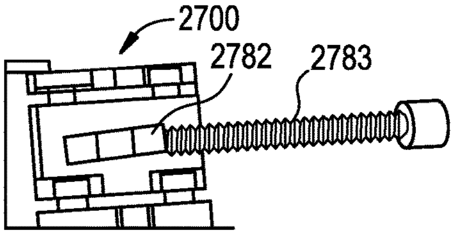
Figure 6Q:
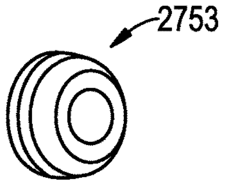
Figure 6R:
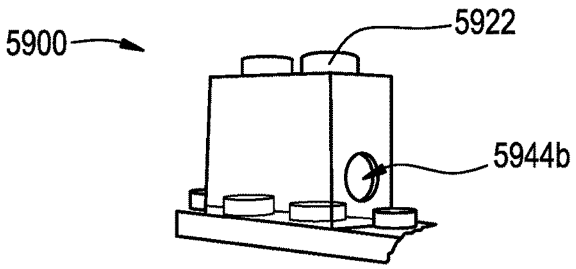
Figure 7A:
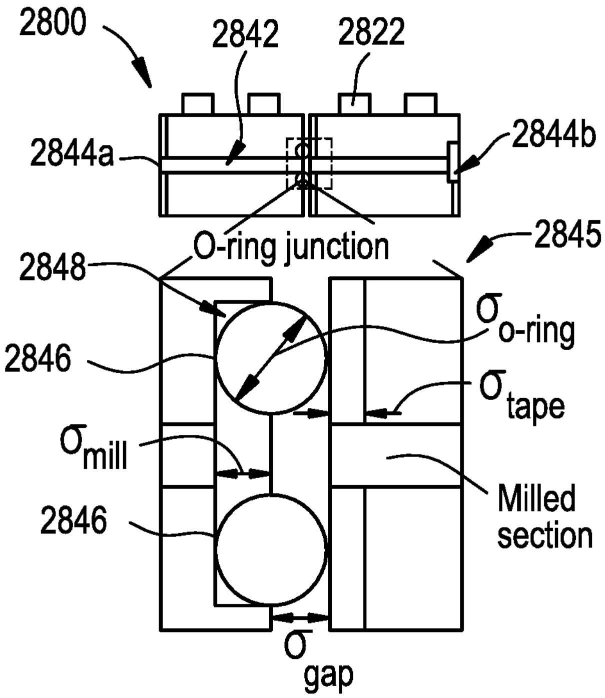
Figure 7B:
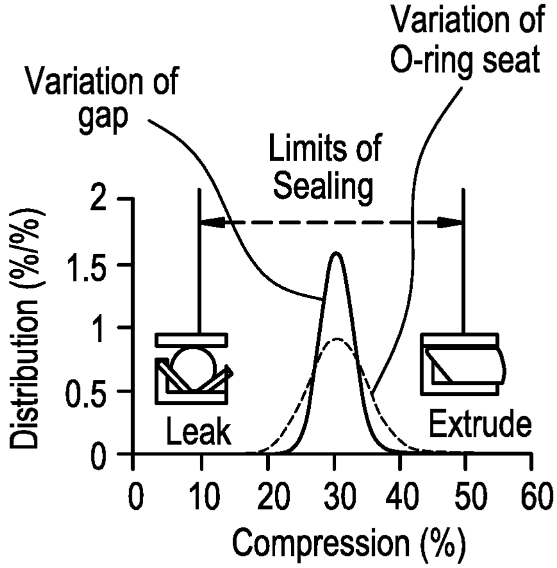
Figure 8A:
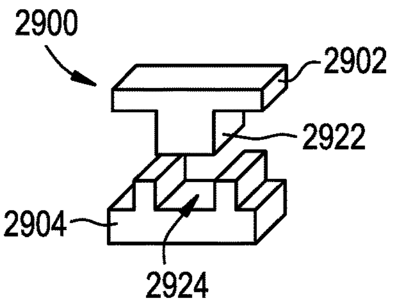
Figure 8B:
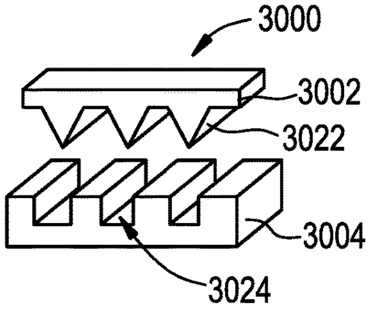
Figure 8C:
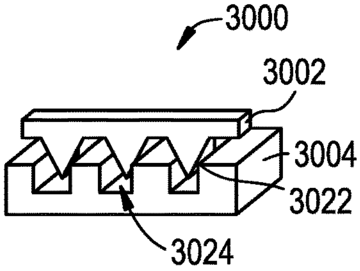
Figure 8D:
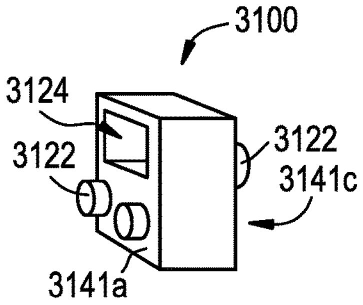
Figure 8E:
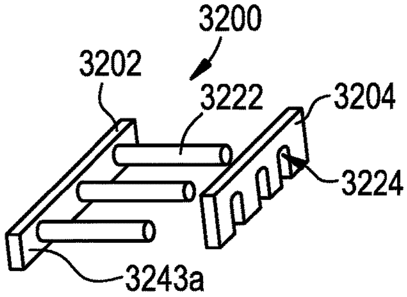
Figure 8F:
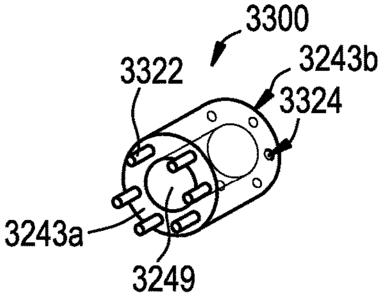
Figure 8G:
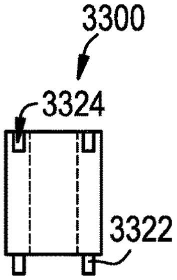
Figure 8H:
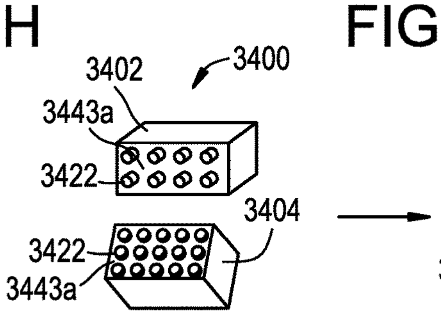
Figure 8I:
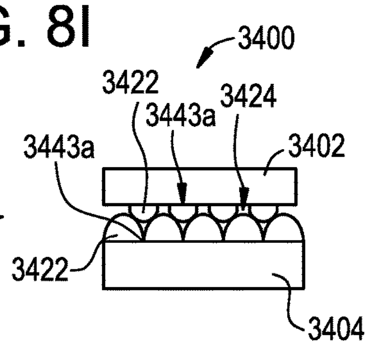
Figure 8J:
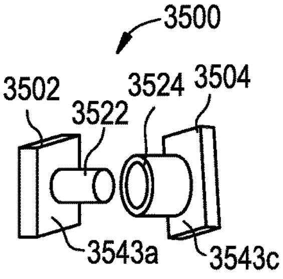
Figure 8K:
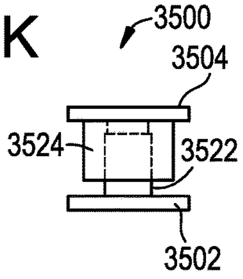
Figure 8L:
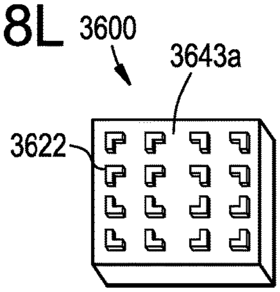
Figure 8M:
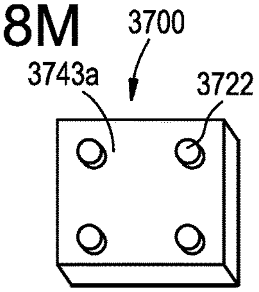
Figure 8N:
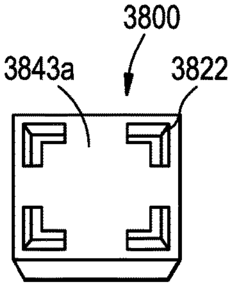
Figure 8O:
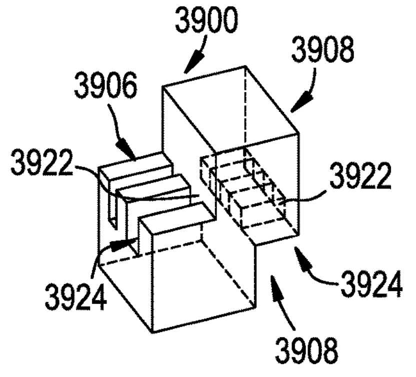
Figure 8P:
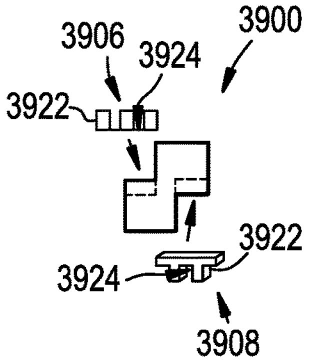
Figure 8Q:
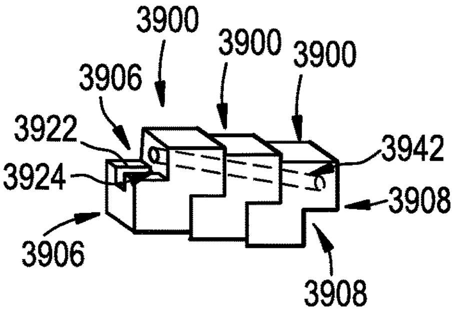
Figure 8R:
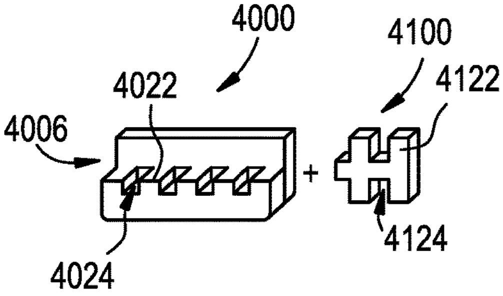
Figure 8S:
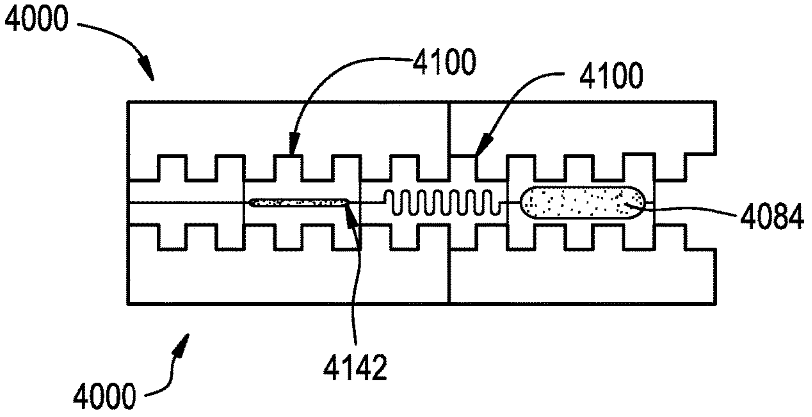
Figure 9A:
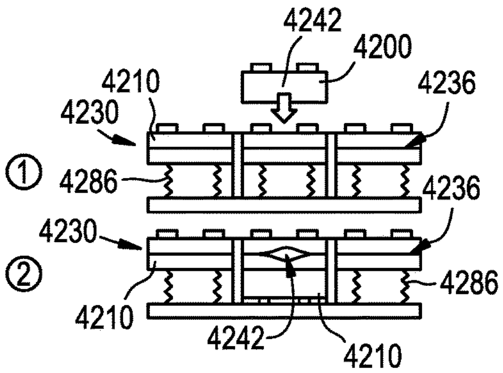
Figure 9B:
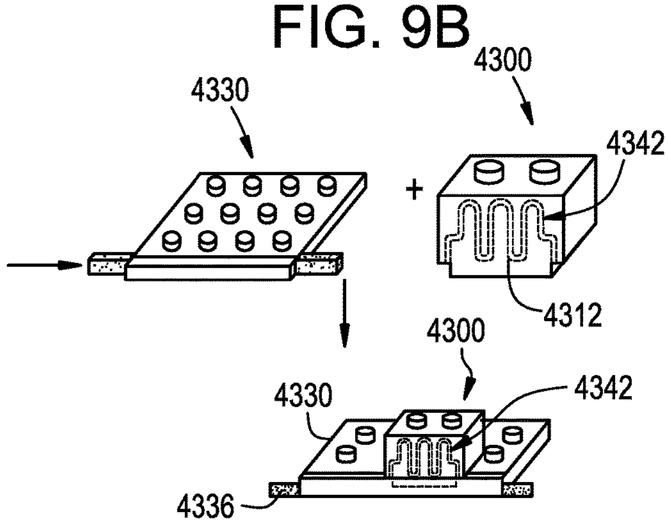
Figure 9C:
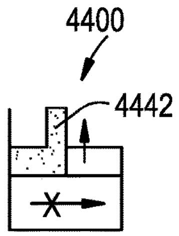
Figure 10A:
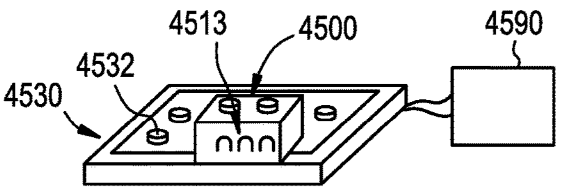
Figure 10B:
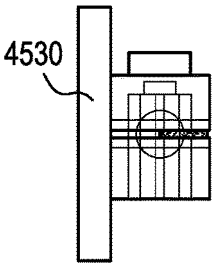
Figure 10C:
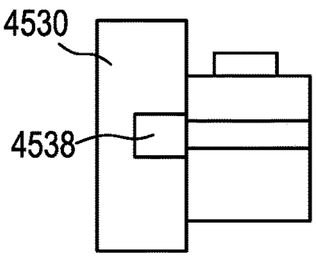
Figure 10D:
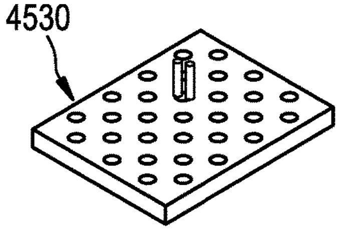
Figure 10E:
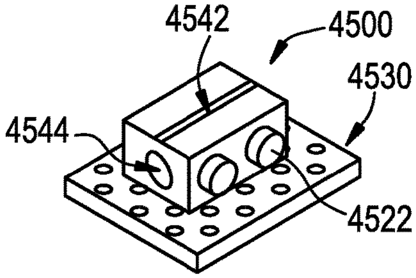
Figure 10F:
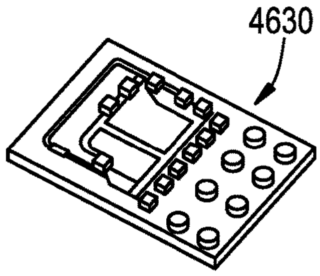
Figure 10G:
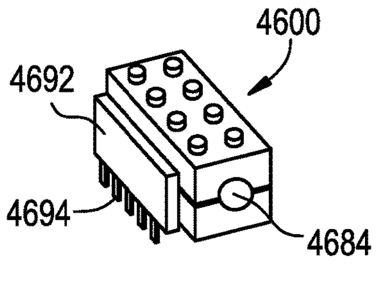
Figure 10H:
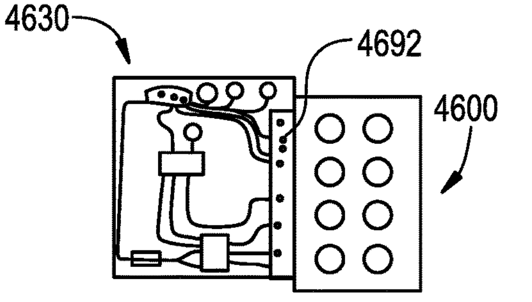
Figure 10I:
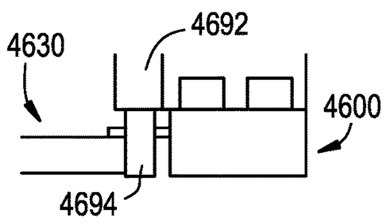
Figure 10J:
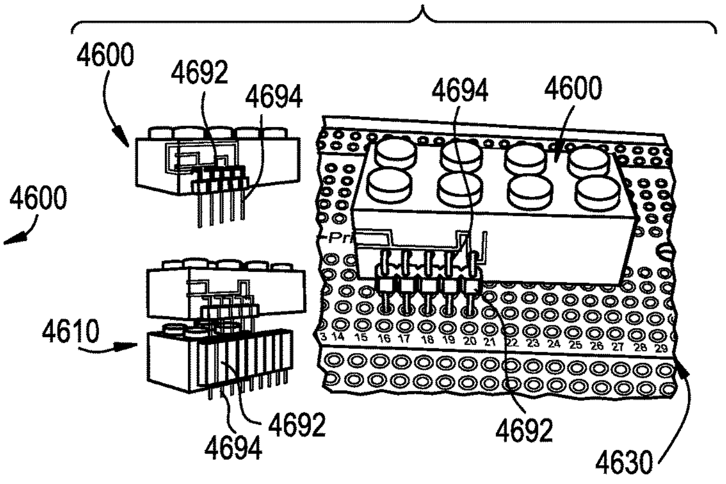
Figure 11A:
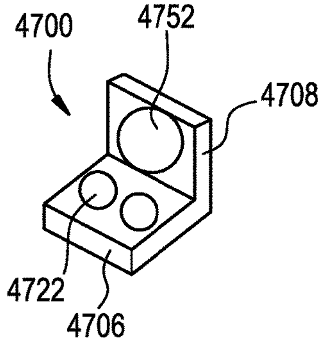
Figure 11B:
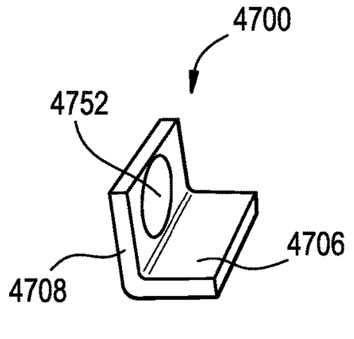
Figure 11C:
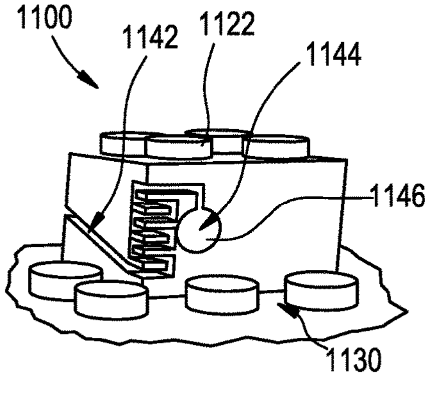
Figure 11D:
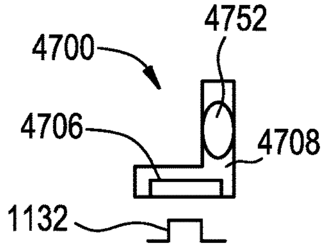
Figure 11E:
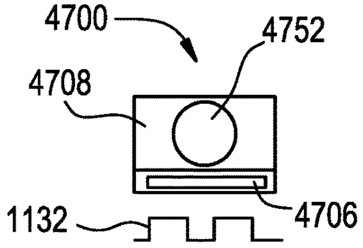
Figure 11F:
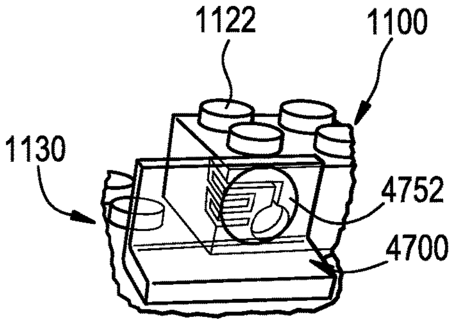
Figure 11G:
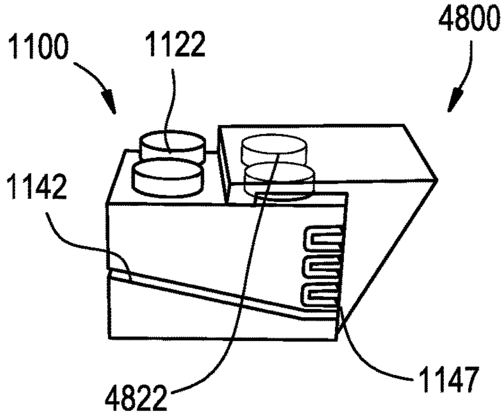
Figure 11H:
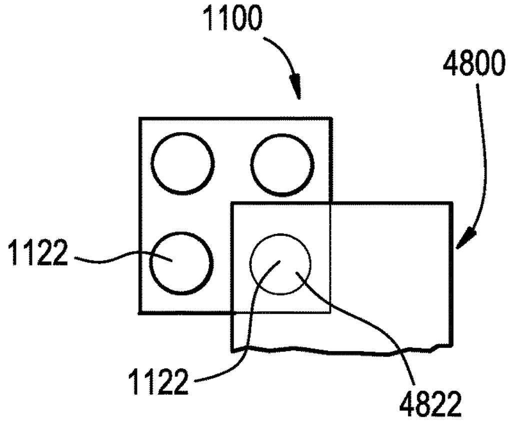
Figure 12A:
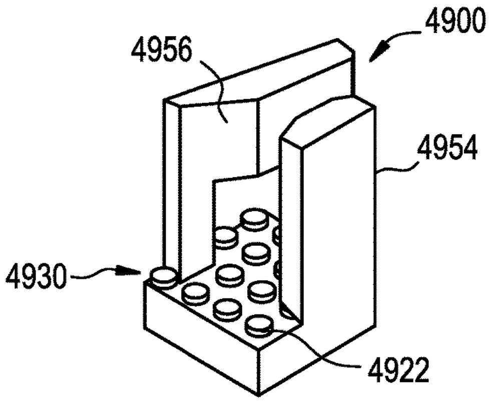
Figure 12B:
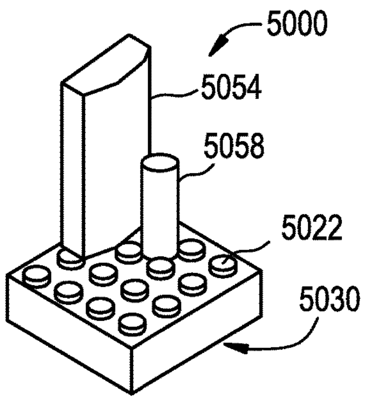
Figure 12C:
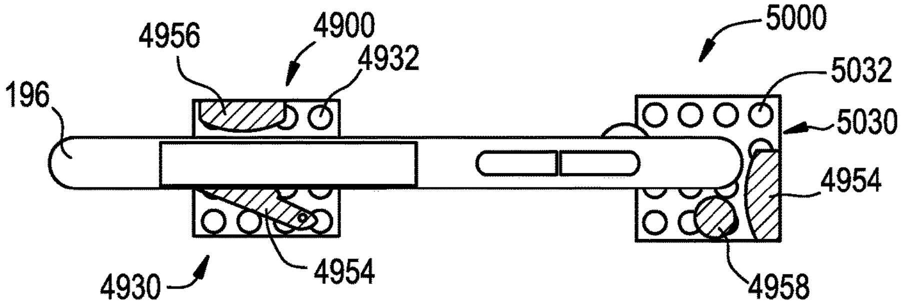
Figure 12D:
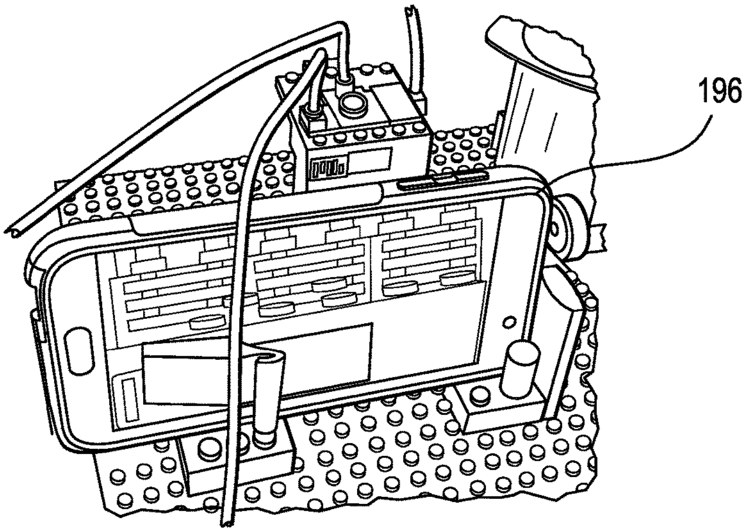
Figure 13A:
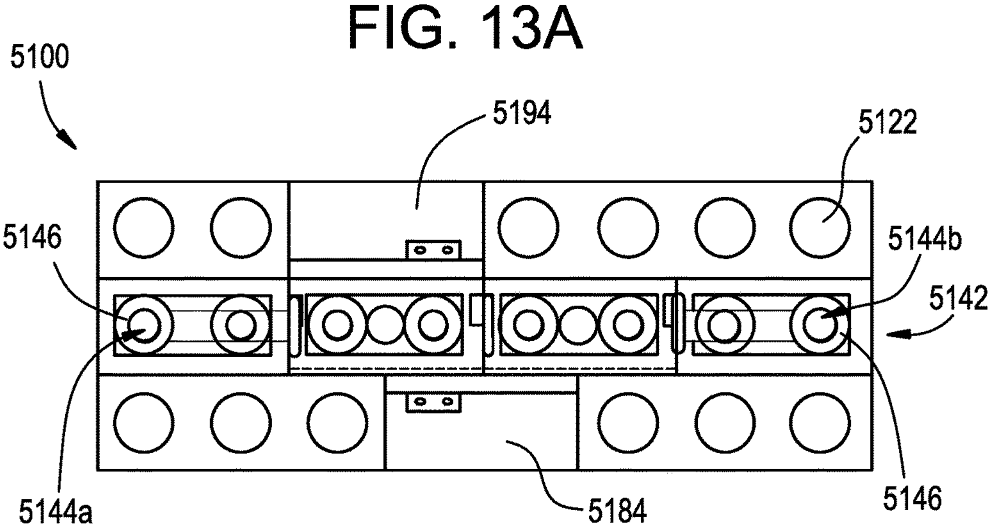
Figure 13B:
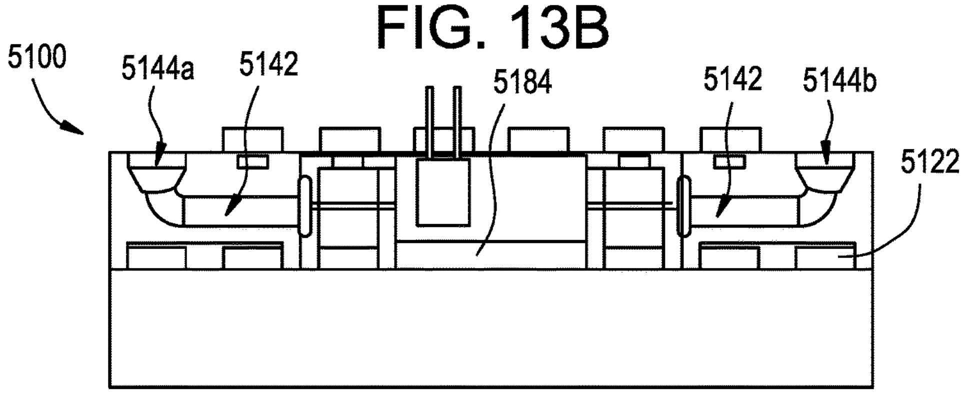
Figure 13C:
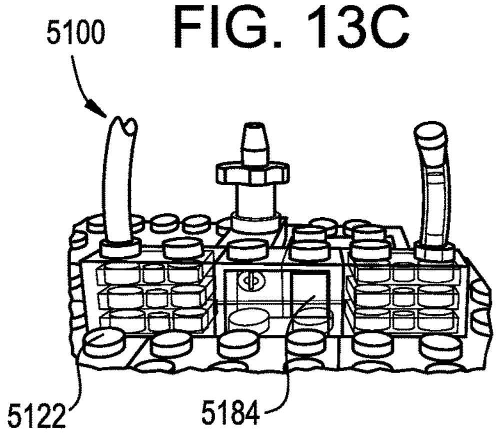
Figure 13D:
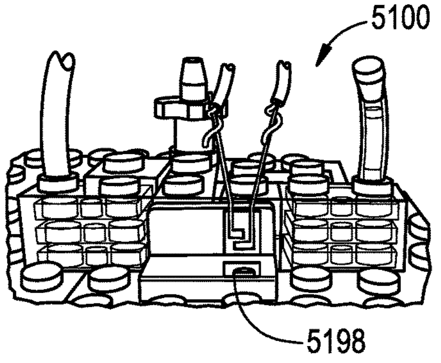
Figure 14A:
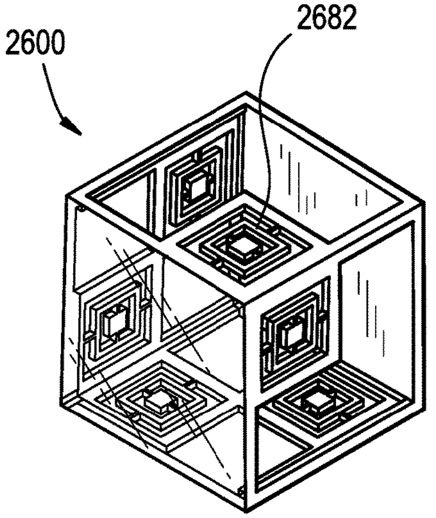
Figure 14B:
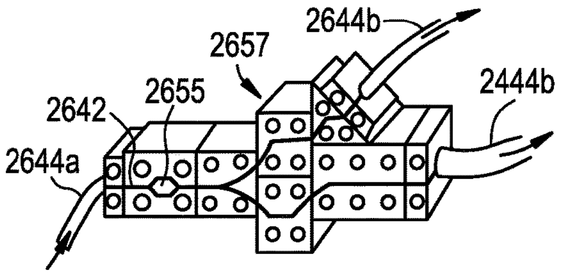
Figure 15:
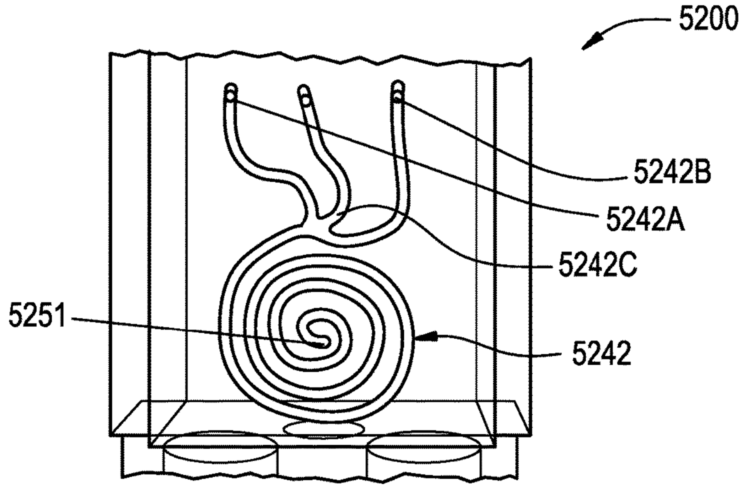
Figure 16A:
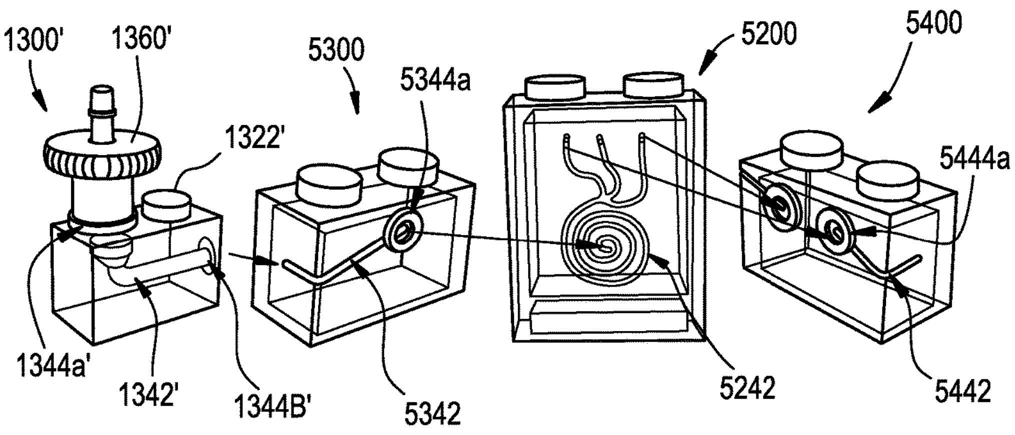
Figure 16B:
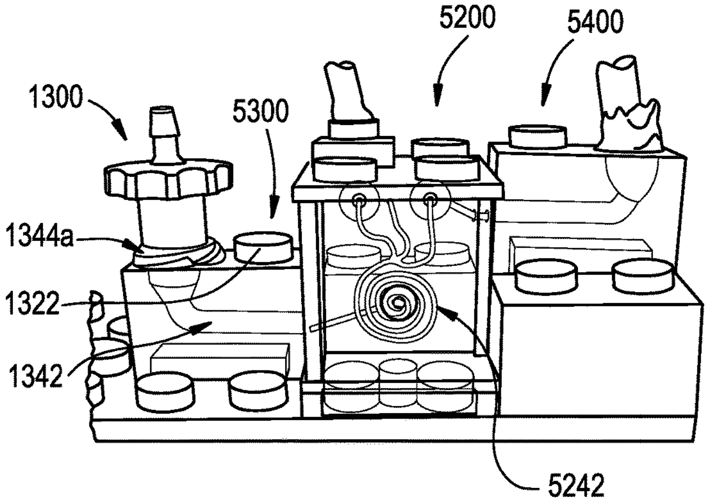
Figure 17A:
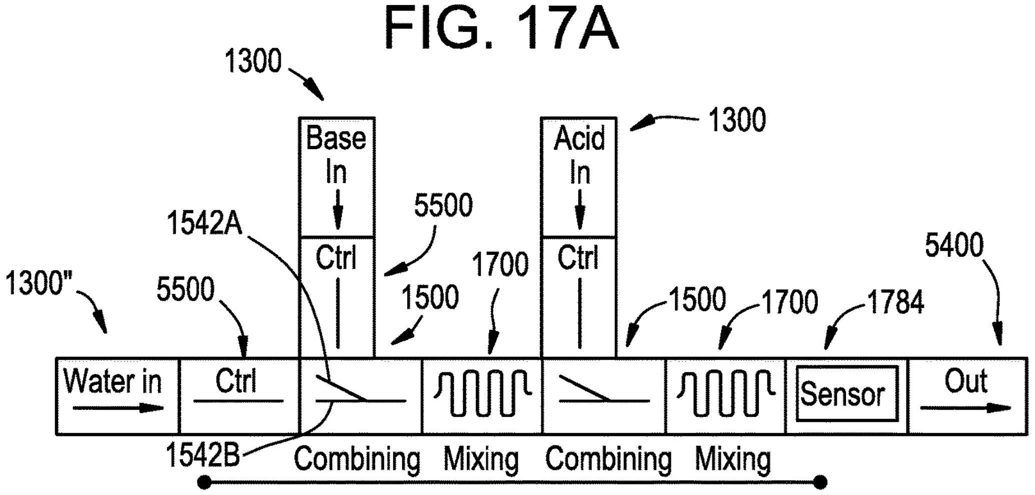
Figure 17B:
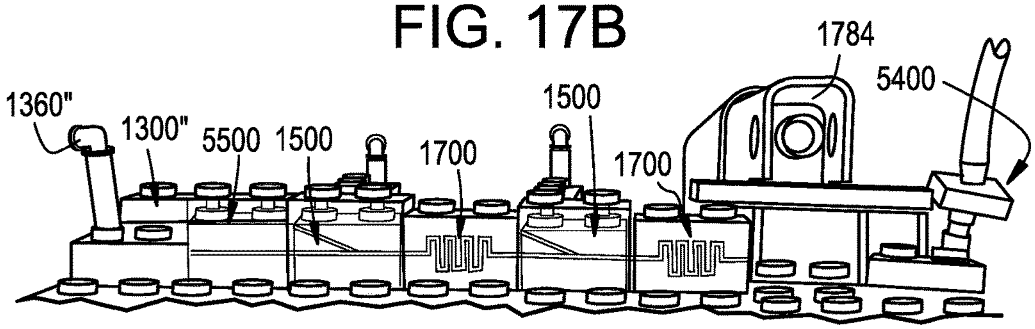
Figure 17C:
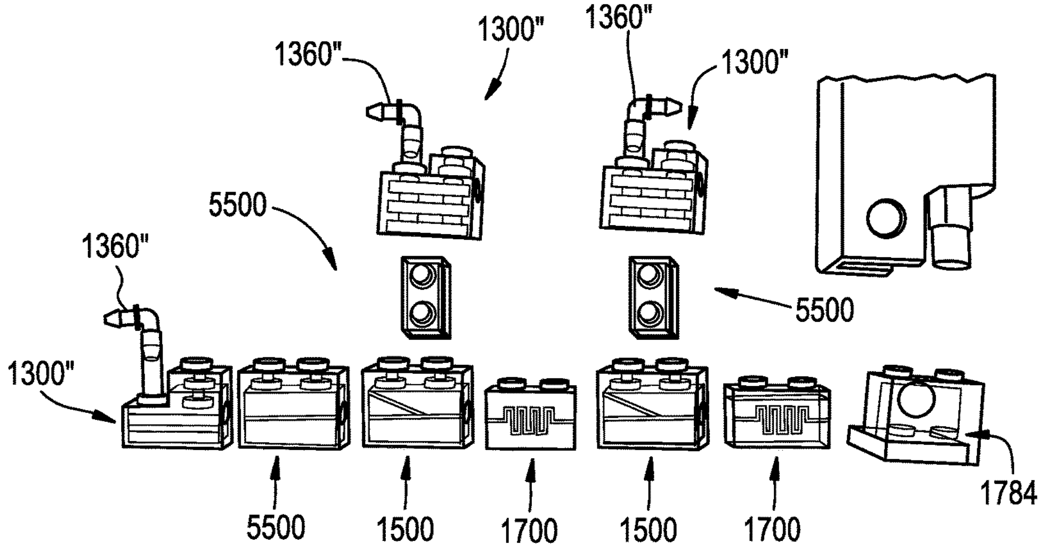
Figure 18A:
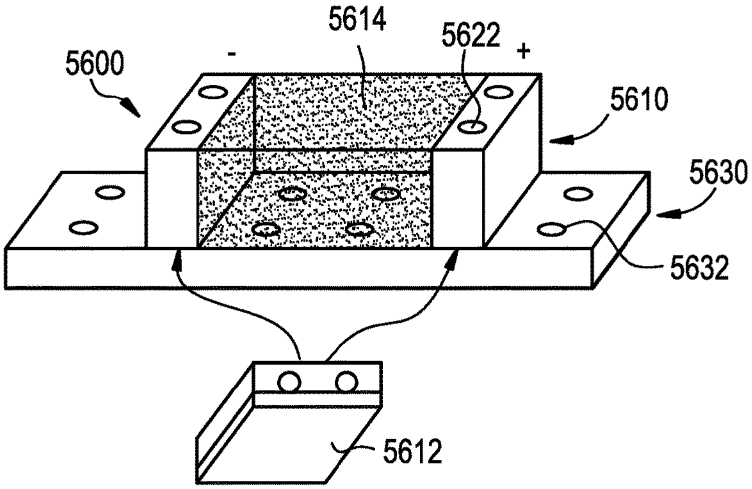
Figure 18B:
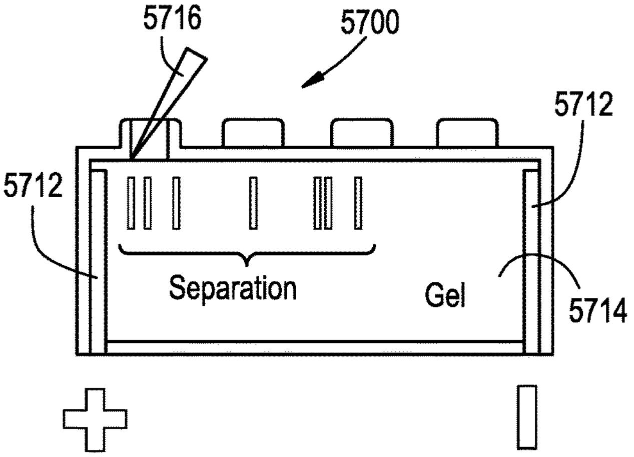
Figure 18C:
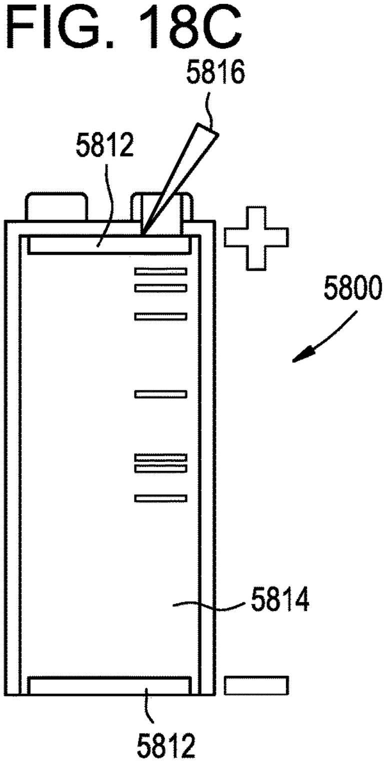
Figure 19:
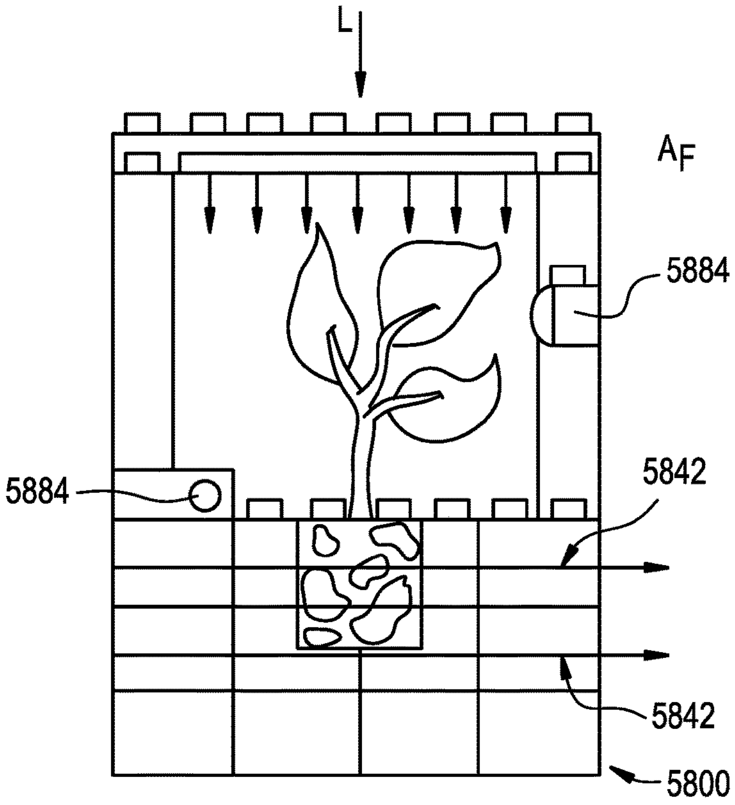
Figure 20:
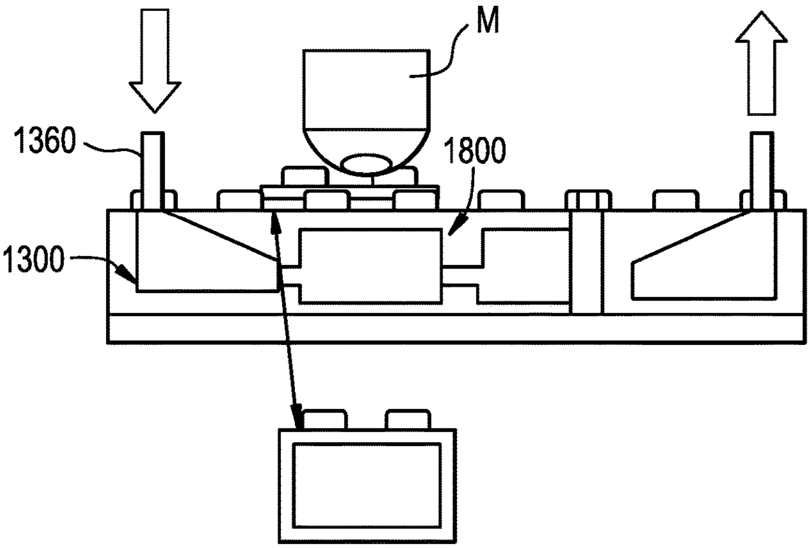
Figure 21A:
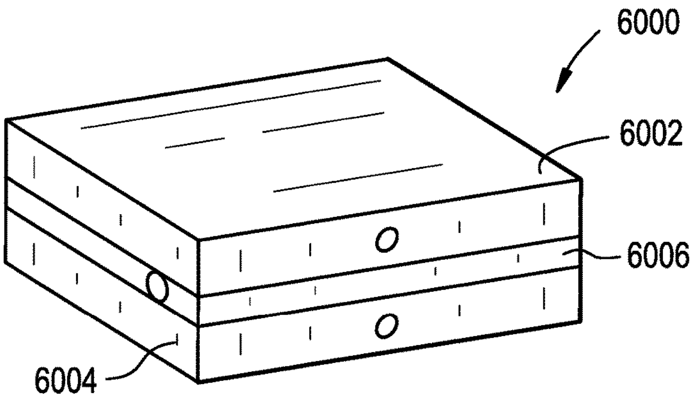
Figure 21B:
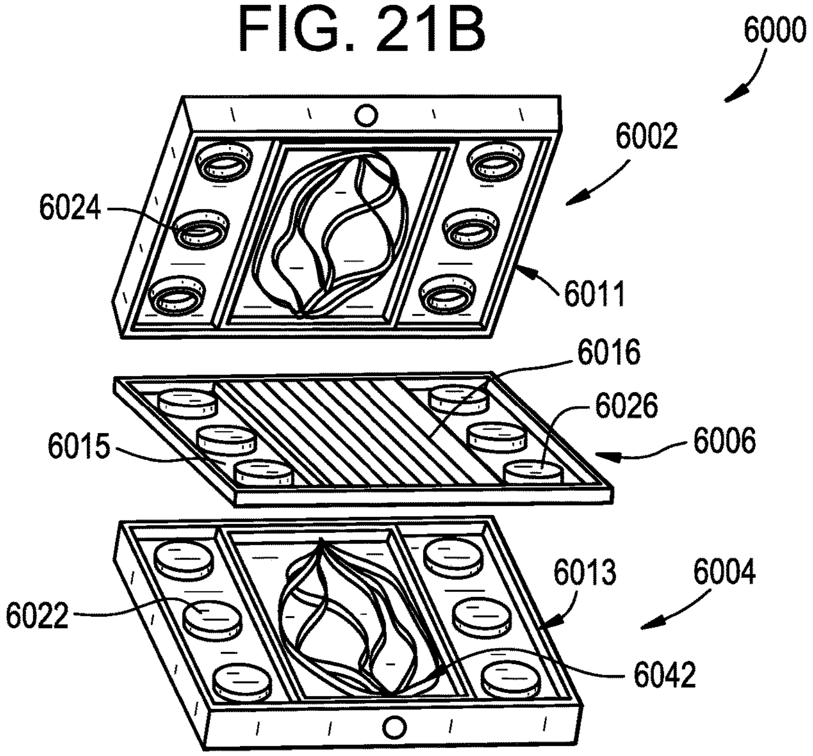

FIG; 4D is a top-cross-sectional view of the modular block of FIG. 4C taken along the line D-D;

FIG. 5A is a perspective view of another exemplary embodiment of a modular block, the block having a channel formed therein;

FIG. 5B is a detailed micrograph of a portion of the channel formed in the modular block of FIG. 5A;

FIG. 5C is a perspective view of still another exemplary embodiment of a modular block, the block having a flow focusing channel formed therein;

FIG. 5D is a detailed micrograph of a portion of the flow focusing channel formed in the modular block of FIG. 5C;

FIG. 5E is a perspective view of another exemplary embodiment of a modular block, the block having a channel formed therein capable of advective mixing;

FIG. 5F is a detailed micrograph of a portion of the channel formed in the modular block of FIG. 5E;

FIG. 5G is a perspective view of yet another exemplary embodiment of a modular block, the block;

FIG. 5H is a detailed micrograph of a portion of a channel formed in the modular block of FIG. 5G;

FIG. 6A is a side view of another exemplary embodiment of a modular block, the block including an inlet and/or outlet;

FIG. 6B is a side view of still another exemplary embodiment of a modular block, the block having an inlet and/or outlet;

FIG. 6C is a side view of another exemplary embodiment of a modular block, the block having a channel configured for producing droplets;

FIG. 6D is a side view of yet another exemplary embodiment of a modular block, the block having a configuration for splitting a fluid;

FIG. 6E is a side view of another exemplary embodiment of a modular block, the block having a configuration for combining and mixing fluid;

FIG. 6F is a side view of still another exemplary embodiment of a modular block, the block being configured for incubation;

FIG. 6G is a side view of another exemplary embodiment of a modular block, the block having a valve disposed therein;

FIG. 6H is a perspective view of yet another exemplary embodiment of a modular block, the block having the ability to provide a fluid pump;

FIG. 6I is a side view of another exemplary embodiment of a modular block, the block having one separation channel configured to be hydrophilic and another separation channel configured to be hydrophobic;

FIG. 6J is a side view of still another exemplary embodiment of a modular block, the block having a filter associated therewith;

FIG. 6K is a side view of another exemplary embodiment of a modular block, the block being configured to have acoustic capabilities;

FIG. 6L is a side view of yet another exemplary embodiment of a modular block, the block having an IR sensor associated therewith;

FIG. 6M is a side view of another exemplary embodiment of a modular block, the block having a capsule configuration;

FIG. 6N is a side view of still another exemplary embodiment of a modular block, the block having the ability to provide heat;

FIG. 6O is a perspective view of another exemplary embodiment of a modular block, the block having magnets associated therewith;

FIG. 6P is a perspective view of yet another exemplary embodiment of a modular block, the block having magnets, and a bolt for locating the magnets, associated therewith;

FIG. 6Q is a perspective view of an exemplary embodiment of a camera that can be used in conjunction with modular blocks provided for in the present disclosure;

FIG. 6R is a perspective view of another exemplary embodiment of modular block, the block have a capacitor for adjusting fluid resistance;

FIG. 7A is a side cross-sectional view of an one exemplary embodiment of a seal junction formed between two modular blocks;

FIG. 7B is a chart illustrating distribution vs. compression at a seal junction similar to the seal junction of FIG. 7A;

FIG. 8A is a perspective view of one exemplary embodiment of complementary mating features for modular blocks;

FIG. 8B is a perspective view of another exemplary embodiment of complementary mating features for modular blocks prior to the blocks being mated;

FIG. 8C is a perspective view of the complementary mating features for the modular blocks of FIG. 8B after the blocks have been mated;

FIG. 8D is a perspective view of an exemplary embodiment of a modular block having two different mating features;

FIG. 8E is a perspective view of another exemplary embodiment of complementary mating features for modular blocks;

FIG. 8F is a perspective view of still another exemplary embodiment of a modular block having two different mating features;

FIG. 8G is a side view of the modular block of FIG. 8F;

FIG. 8H is a perspective view of still another exemplary embodiment of complementary mating features for modular blocks, the blocks being shown prior to being mated;

FIG. 8I is a side view of the complementary mating features for the modular blocks of FIG. 8H after the blocks have been mated;

FIG. 8J is a perspective view of another exemplary embodiment of complementary mating features for modular blocks, the blocks being shown prior to being mated;

FIG. 8K is a side view of the complementary mating features for the modular blocks of FIG. 8J after the blocks have been mated;

FIG. 8L is a perspective top view another exemplary embodiment of a modular block;

FIG. 8M is a perspective top view of still another exemplary embodiment of a modular block;

FIG. 8N is a perspective top view of another exemplary embodiment of a modular block;

FIG. 8O is a perspective side view of yet another exemplary embodiment of a modular block, the block having a stepped configuration;

FIG. 8P is a side view of the modular block of FIG. 8O;

FIG. 8Q is a perspective side view of a plurality of the modular blocks of FIG. 8O mated together;

FIG. 8R is a perspective view of an exemplary embodiment of two modular blocks having complementary mating features;

FIG. 8S is a perspective view of the two modular blocks of FIG. 8R being used in conjunction with similarly configured blocks;

FIG. 9A provides a schematic side view of one exemplary embodiment of a method for replacing one modular block with another modular block in a microfluidic system;

FIG. 9B provides a schematic perspective view of one exemplary embodiment of a microfluidic system that includes a baseplate and a modular block configured to be coupled together with both the baseplate and the modular block being configured to have fluid passed therethrough and/or across;

FIG. 9C is a side view of another exemplary embodiment of a block that can be used in conjunction with the baseplate of FIG. 9B;

FIG. 10A is a perspective view of one exemplary embodiment of a microfluidic system that includes an electronic circuit;

FIG. 10B is a side view of a circuit board and modular block of the microfluidic system of FIG. 10A;

FIG. 10C is a side view of the circuit board and modular block of FIG. 10B, further showing a pin;

FIG. 10D is a perspective view of the circuit board of FIG. 10B;

FIG. 10E is a perspective view of the circuit board and modular block of FIG. 10B;

FIG. 10F is a perspective view of a circuit board that can be used in conjunction with microfluidic systems of the present disclosure;

FIG. 10G is a perspective view of a modular block having a chip associated therewith;

FIG. 10H is a top view of the modular block and chip of FIG. 10G coupled to the circuit board of FIG. 10F;

FIG. 10I is a side view of the combination of the modular block, chip, and circuit board of FIG. 10H;

FIG. 10J is a combination of perspective view of the combination of FIG. 10H;

FIG. 11A is a perspective view of one exemplary embodiment of a lens;

FIG. 11B is a further perspective view of the lens of FIG. 11A;

FIG. 11C is a perspective view of an exemplary embodiment of a modular block configured for advective mixing;

FIG. 11D is a front view of the lens of FIG. 11A and an exemplary embodiment of a baseplate prior to being coupled together;

FIG. 11E is a side view of the lens of FIG. 11A and the baseplate of FIG. 11D prior to being coupled together;

FIG. 11F is a front perspective view of the lens of FIG. 11A and the modular block of FIG. 11C being coupled to the baseplate of FIG. 11D;

FIG. 11G is a front perspective view of a modular block configured for advective mixing having a prism block coupled thereto;

FIG. 11H is a top view of the modular block and prism block of FIG. 11G;

FIG. 12A is a perspective top view of on exemplary embodiment of a modular block configured to hold a portion of a phone;

FIG. 12B is a perspective top view of another exemplary embodiment of a modular block configured to hold a second portion of a phone, working in conjunction with the modular block of FIG. 12A;

FIG. 12C is a top view of the modular blocks of FIGS. 12A and 12B holding a phone;

FIG. 12D is a top perspective view of a microfluidic system being used in conjunction with the modular blocks and phone of FIG. 12C;

FIG. 13A is a top view of one exemplary embodiment of a microfluidic system;

FIG. 13B is a side view of the microfluidic system of FIG. 13A;

FIG. 13C is a perspective front view of the microfluidic system of FIG. 13A with the sensor block absent;

FIG. 13D is a perspective front view of the microfluidic system of FIG. 13A with the sensor block in place;

FIG. 14A is a perspective view of the modular block of FIG. 6O in a partially deconstructed form;

FIG. 14B is a schematic perspective view of a microfluidic system using modular blocks of the nature illustrated in FIG. 6O;

FIG. 15 is a front view of one exemplary embodiment of a modular block, the block having a channel formed therein for sorting fluid;

FIG. 16A is a perspective view of four modular blocks of a microfluidic system, including the modular block of FIG. 15;

FIG. 16B is a perspective front view of the four modular blocks of FIG. 16A coupled to a baseplate;

FIG. 17A is a schematic diagram of one exemplary embodiment of a microfluidic system;

FIG. 17B is a front perspective view of an actual set-up of the microfluidic system diagramed in FIG. 17A;

FIG. 17C is an exploded view of the actual set-up of the microfluidic system of FIG. 17B;

FIG. 18A is a perspective front view of one exemplary embodiment of a microfluidic system configured to have an electrical field passed across a gel disposed between two modular blocks;

FIG. 18B is a schematic side view of one exemplary embodiment of a microfluidic system formed in a modular block that is configured to have an electrical field passed across the block;

FIG. 18C is a schematic side view of another exemplary embodiment of a microfluidic system formed in a modular block that is configured to have an electrical field passed across the block;

FIG. 19 is a schematic front view of one exemplary embodiment of a microfluidic, hydroponic system configured to be used to grow a plant;

FIG. 20 is a schematic front view of one exemplary embodiment of a microfluidic system configured to culture bacteria;

FIG. 21A is a perspective view of one exemplary embodiment of a culture block of a biological system;

FIG. 21B is an exploded view of the culture block of FIG. 21A; and

Figure 21C:
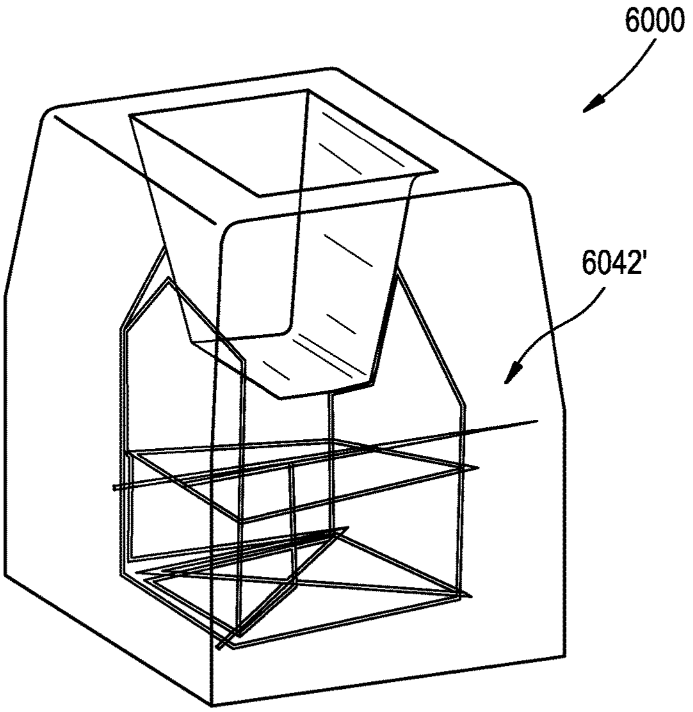

FIG. 21C is a perspective view of an exemplary embodiment of channel patterns formed in a culture block similar to the culture block of FIG. 21A.

Notably, while some of the illustrated embodiments appear to be at least partially transparent, they are not necessarily labeled as such because in some exemplary embodiments components such as modular blocks can be formed from one or more materials that provide a transparent viewing surface through which inner portions of the block(s) can be seen.

DETAILED DESCRIPTION

Certain exemplary embodiments will now be described to provide an overall understanding of the principles of the structure, function, manufacture, and use of the systems, devices, and methods disclosed herein. One or more examples of these embodiments are illustrated in the accompanying drawings. Those skilled in the art will understand that the systems, devices, and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention. Further, to the extent features, sides, or steps are described as being "first" or "second," such numerical ordering is generally arbitrary, and thus such numbering can be interchangeable. Still further, in the present disclosure, like-numbered components of various embodiments generally have similar features when those components are of a similar nature and/or serve a similar purpose.

It will be appreciated that, for convenience and clarity, spatial terms such as "top," "bottom," "up," and "down," may be used herein with respect to the drawings. However, these systems can be set-up using various orientations and positions, and these terms are not intended to be limiting and/or absolute. To the extent that linear or circular dimensions are used in the description of the disclosed systems, devices, and methods, such dimensions are not intended to limit the types of shapes that can be used in conjunction with such systems, devices, and methods. A person skilled in the art will recognize that an equivalent to such linear and circular dimensions can easily be determined for any geometric shape. Further, a number of different terms can be used interchangeably while still being understood by the skilled person. By way of non-limiting example, the terms "blocks" and "bricks" are generally used interchangeably, as are the terms side, face, wall, outer surface, and other similarly recognized words to describe an outer surface of an object such as the blocks and bricks in which channels are formed. Further, the terms "in" and "on" may be used interchangeably to describe forming a particular configuration (e.g., a channel) with respect to a block or brick and a person skilled in the art will recognize that usage of one of the terms "in" and "on" can cover both "in" and "on." Additionally, the present disclosure includes some illustrates and descriptions that include prototypes or bench models. A person skilled in the art will recognize how to rely upon the present disclosure to integrate the techniques, systems, devices, and methods provided for into a product in view of the present disclosures.

The present disclosure generally relates to systems, devices, and methods for microfluidics, and more particularly relates to creating customized microfluidic systems using modular blocks. The modular blocks can be standardized such that many (or even all) of the blocks begin without having any channels or other components of a microfluidic path (e.g., passages such as inlet apertures and outlet apertures, seals, etc.) formed in them but each block "type" can have a consistent size and shape (e.g., a 1×1 block, a 2×2 block, etc.), where in this embodiment the two numbers identify the number of rows and columns of locating protrusions disposed on the top surface of a block. Different types of blocks can have different shapes and different sizes. In many exemplary embodiments the modular blocks are pre-existing, such as mass-produced blocks and the like that a creator and/or user of such microfluidic systems can readily acquire (e.g., purchase). Some non-limiting examples of such pre-existing blocks include LEGO®, Wonder Bricks, Nanoblocks$^+$®, Duplo®, K'Nex®, and Meccano® building blocks and other components. Alternatively, the modular blocks can be produced by the creator and/or user of the microfluidic system, such as through three-dimensional printing. In either instance, the modular blocks can be transformed from a block structure having little or no microfluidic components formed in and/or on them, to blocks having a microfluidic path, or at least a portion of such a path, formed in and/or on the blocks. For example, one or more channels can be formed in the blocks (e.g., milled on one or more surfaces of the block and/or formed through an internal volume of the block) to form a microfluidic path, or a portion of such a path, thus allowing for controlled and directed flow of a fluid across the path. Of course, if the block is being produced by the creator and/or user of the microfluidic system, such microfluidic components can be included as part of the blocks during the manufacturing process. Further, one or more of the modular blocks can be adapted or otherwise used to perform some sort of active function related to fluid passing through the microfluidic system (e.g., sensing, measuring, testing, sorting, etc.).

Regardless of how the modular blocks are initially acquired and/or how they are modified to be used in conjunction with a microfluidic system, when multiple blocks are used to form a fluid pathway, a seal can be formed between the blocks to prevent fluid from leaking as it travels from one block to another. For example, a seal can be disposed at a passage (e.g., an outlet aperture) of a first block and a passage (e.g., an inlet aperture) of a second block that is to be disposed adjacent to the first block to create a path between the respective passages that is sealed. Also regardless of how the blocks are acquired and/or modified, in use the blocks can be easily moved and manipulated around the space in which the system is being created. This is at least because of the uniform nature of the various block types. For example, the blocks can be selectively coupled to a baseplate having precision locating features (e.g., protrusions) disposed on a top surface of the base plate, and the blocks can be configured to be selectively removably and replaceably couple to the precision locating features of the baseplate. One non-limiting example of a complementary mating feature associated with the blocks for the removable and replaceable coupling can be one or more precision locating posts extending towards a mating, e.g., bottom, surface of the block. The post(s) can engage the precision locating features, such as by an interference or elastic fit, to maintain the location of the block with respect to the baseplate. Alternatively, or additionally, a further complementary mating feature associated with the blocks for the removable and replaceable coupling can be an inner surface of the sidewalls of the block, proximate to a bottom, mating surface of the block. Similar to and/or in conjunction with the post(s), the inner surface can engage the precision location features, such as by an interference or elastic fit, to maintain the location of the block with respect to the base plate. The interference or elastic fit, however, can be such that the block can be removed from its attachment location with respect to the baseplate to be moved to another location on the baseplate and/or replaced by another block. As a result, of the present disclosures, any number of microfluidic systems can be made, and methods for using any sort of microfluidic analysis techniques can be utilized, just by taking uniform block types and creating microfluidic features in such blocks. The disclosures provide for the flexibility to adjust microfluidic systems' and methods' designs based on a user's desire, while keeping the precision necessary due to the uniformity of the underlying construct in and/or on which the microfluidic paths are formed.

Figure 1A:
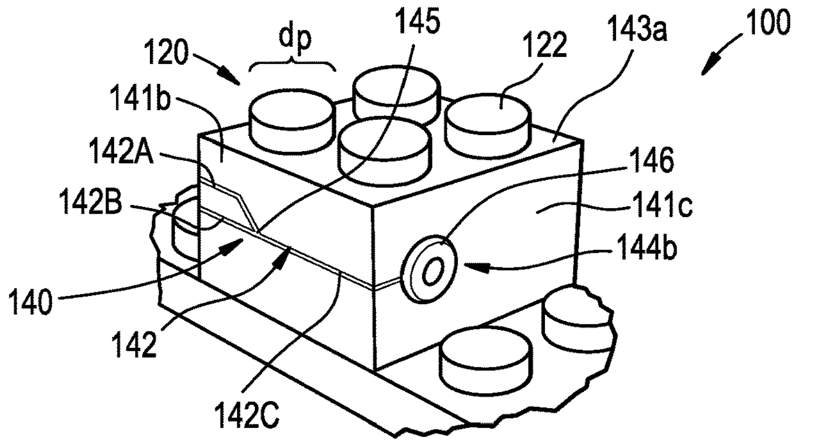
FIG. 1A is a perspective top view of one exemplary embodiment of a modular block.
Figure 1B:
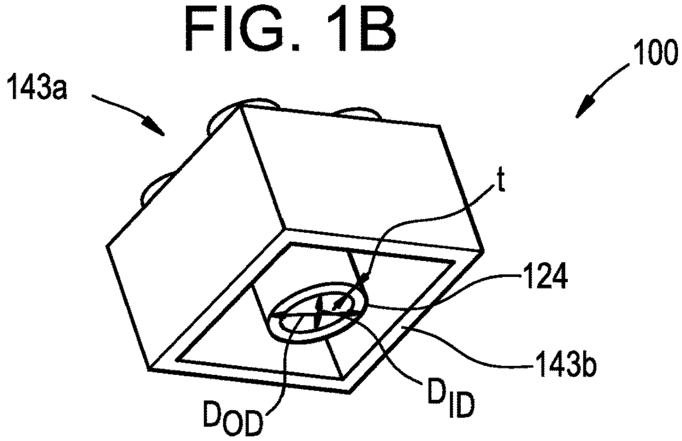
FIG. 1B is a perspective bottom view of the modular block of FIG. 1A.
Figure 1C:
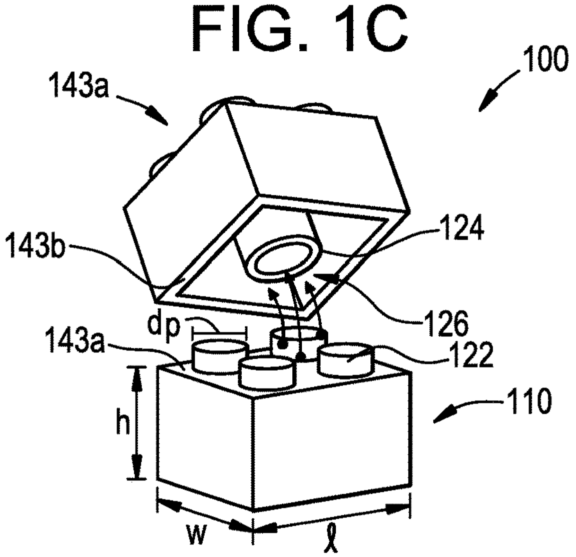
FIG. 1C is a perspective bottom view of the modular block of FIG. 1A being mated to a similar configured modular block.

FIGS. 1A and 1B illustrate a single modular block or brick 100 for use in conjunction with a microfluidic system. FIG. 1C illustrates the singular modular block being connected to a second, similarly-constructed block 110. The modular block 100 is substantially shaped like a rectangular prism, and thus includes six general outer surfaces or faces defined as a first, second, third, and fourth sides, with the first and third sides being opposed, i.e., facing, and the second and fourth sides being opposed, i.e., facing. Sides that are adjacent to each other are substantially perpendicular to each other. In other modular block configurations, sides may be adjacent without necessarily being substantially perpendicular, depending on the configuration of the modular block (i.e., the block may not be a rectangular prism shape). In the illustrated embodiment, the visible faces have channels formed in it, with one face also including an outlet aperture 144*b* with a seal 146 disposed at the aperture. However, prior to the existence of such channels, passage, and seal, the sides can be substantially smooth, although they do not necessarily have to be initially smooth. The other two surfaces are a top surface 143*a* and a bottom surface 143*b*, which are in contact (or sometimes formed by) the four sides and are opposed to each other, with, at least in the illustrated embodiment, the bottom surface 143*b* mainly being the terminal ends of the four side surfaces. To the extent any surface of a block mates to another block, including a baseplate, that surface can be referred to as a mating surface.

The modular block can include one or more precision locating features or geometries 120. In the illustrated embodiment, there are both precision locating protrusions 122 and a precision locating post 124. A further precision locating feature can be an inner surface of the sidewalls of the block, proximate to the mating, i.e., bottom, surface. As shown, there are four precision locating protrusions 122 formed on the top surface of the block. In some instances, these protrusions can also be referred to as posts. Each is generally cylindrical with a circular cross-section, and each extends a distance above the top surface of the block. They are formed symmetrically, although they do not have to be. They are also formed such that each has the same shape and size, although they do not necessarily have to be either. Another illustrated precision locating feature is a post 124 that extends from the top surface and towards the mating, e.g., bottom, surface. The post 124 is generally cylindrical with a circular cross-section. As shown the post is cannulated, thus providing some added flexibility to assist in mating the post with precision locating features (e.g., protrusions) formed on another brick and/or a baseplate. The area surrounding the post 124 can be space in which such precision locating features of another block 110 and/or a baseplate 130 can be disposed, with such precision locating features 122 engaging a bottom portion of the post 124 to removably couple the two components together. A third precision locating feature is each side wall of the block 100. More particularly, inner surfaces of the sidewalls of the block 100, for instance a portion proximate to the bottom, matting surface, can engage the protrusions 122 and have an interference or elastic fit to assist in removably coupling the block 100 to the block 110. Engagement between protrusions and inner surfaces of sidewalls can be particularly common for embodiments of blocks that do not include a post, such as some 1×1 and 1×2 blocks, among others.

Notably, the features of "protrusions" and "posts," as well as the inner surface of the sidewalls, are just examples of precision locating features, and elastically averaged contacts in many instances, and are by no means limiting on the types of configurations that can be used as a precision locating feature. More generally, complementary precision locating features can be any structures that allow for reversible mating that is secure when mated, for instance because the features have opposite curvatures, particular flexibility or pliability, etc. Still further, to the extent feature such as protrusions and posts are described as being on a top surface, bottom surface, extending toward a bottom surface, etc., a person skilled in the art will recognize that mating features that can be used in conjunction with the modular blocks provided for in the present disclosure can be located anywhere on the blocks, including, by ways of non-limiting example, on sides, corners, on multiple sides, outer surfaces of a cylindrical structure, etc.

As described further below, modular blocks used in conjunction with the present disclosures can have a plethora of types, with different types have different sizes and shapes. Because such blocks can be pre-existing blocks, these various types, sizes, and shapes are known, or at least can be easily derived by a person skilled in the art in view of the present disclosures. Some non-limiting examples of pre-existing modular blocks that can be used include: LEGO®, Wonder Bricks, Nanoblocks$^{+}$®, Duplo®, K'Nex®, and Meccano® building blocks and other components. Accordingly, to the extent any dimensions are used to describe the various blocks provided for herein, they are in no way limiting. To provide some context for the size of the illustrated block though, they are provided. In the illustrated embodiment, the block 100 has a length l and width w that is approximately 0.6 inches, and a height h that is approximately 0.4 inches, with the measurements being based on the distance between the defined surfaces as shown. Further, a diameter $d_p$ of each of each of the protrusions 122 can be approximately 0.125 inches, an outer diameter $D_{OD}$ of the post 124 can be approximately 0.1875 inches, and a thickness t of the post 124 between its outer diameter $D_{OD}$ and inner diameter $D_{ID}$ can be approximately 0.06 inches. A person having ordinary skill in the art would understand that the space 126 between the outer diameter of the post $D_{OD}$ and a wall of the block 100 can be sized such that a post having a diameter $d_p$ can be received therebetween. A variety of other non-limiting block configurations are described below, including with respect to FIGS. 8A-8S, while their dimensions are not necessarily provided, they can be understood from the present disclosure, or at the very least be easily derived by a person skilled in the art. Known modular blocks can generally be manufactured using known molding or casting processes, although other manufacturing processes (e.g., various forms of three-dimensional printing, like additive manufacturing) can also be used to create modular blocks.

The modular block 100 can include one or more microfluidic components 140 formed in and/or on the block 100. In the illustrated embodiment, one of the microfluidic components is at least one channel 142 formed in one or more surfaces of the block. In many instances, the channel may be a microchannel given the small nature of many microfluidic systems and devices, although a channel does not necessarily have to be a microchannel. To the extent the term "microchannel" is used herein, it is not limiting to only being a "micro" size. A person skilled in the art will recognize that a design that includes a "microchannel" can be easily modified to have a channel that is considered larger than a "microchannel." In some instances, a microchannel may be considered a channel having a geometry that enables fluid manipulation at a Reynolds number that is less than about 2000, which can be typical in a sub-millimeter dimensions channel. Likewise, to the extent the present disclosure describes microfluidic paths, systems, etc., a person skilled in the art will recognize that such paths, systems, etc. can be on a larger, e.g., "milli" or even larger, scale (or smaller for that matter), and thus not necessarily "micro." Channels or other microfluidic components can be formed in and/or on blocks using additive manufacturing processes and/or machining processes, such as those provided for herein (e.g., milling), or other manufacturing processes known to those skilled in the art.

As shown, the microchannel 142 is formed in three adjacent surfaces, although only two are visible. The illustrated configuration is sometimes referred to as a junction block. The channel starts at two inlet apertures (not shown) formed on a first side (not shown), with the microchannel 142 including separate branches (not shown) from each of the two apertures. The branches 142A, 142B extend onto a second side 141*b* before meeting at a junction 145, at which they form a third branch 142C of the microchannel 142. The combination of the first two branches 142A, 142B and the third branch 142C extend an entire length of the second side 141*b*, and the third branch 142C subsequently extends onto a third side 141*c* in which an outlet aperture 144*b* is formed. Fluid can thus be inserted into one or both inlet apertures, pass across the branches and to the outlet aperture 144*b*. When both inlet apertures are used, the fluids mix at the junction 145. Although for purposes of this description the illustrated microchannel 142 is referred to as a single microchannel having a plurality of branches (as shown branches 142A, 142B, and 142C, with 142C extending across two surfaces), alternatively each branch can be considered its own microchannel and/or whenever a microchannel changes surfaces, they can be considered distinct branches or microchannels.

Various processes for forming microchannels are provided herein, as are many different configurations of microchannels or other microfluidic components. Further, although the terms inlet apertures and outlet apertures are used in the present disclosure, a person skilled in the art will recognize that an inlet aperture can actually serve as an outlet aperture and an outlet aperture as an inlet aperture when flow is reversed, which is possible for many of the systems, devices, and methods provided for in the present disclosure. Accordingly, an inlet and outlet aperture may also more generally be referred to as a passage (e.g., first passage, second passage, etc.), and the terms inlet and outlet should not be considered so limiting as to only allow flow in a single direction; they can double as the other type of aperture. Still further, an inlet aperture or outlet aperture can also be referred to as an inlet or outlet more generally.

An additional microfluidic component that is provided in the illustrated embodiment is a seal or sealing feature, as shown an O-ring 146 (e.g., size 001-½, ⅛" outer diameter, EPDM rubber, McMaster-Carr) disposed in the outlet aperture 144*b*. A seal can also be provided at the inlet aperture. The seal can take a variety of configurations, based, at least in part, on configurations of the components with which it is used, e.g., the size and shape of the aperture in which it is disposed. In some embodiments, the seal can be a gasket. In some other embodiments, the seal can be integral with the block. In still some other embodiments, the seal can be formed by simple face contact between two modular blocks, absent a seal such as an O-ring or gasket. Such seals, and any seals or the like provided for herein, can be reversible or permanent as desired. Use of the term "seal" herein is not intended to be limited to a single identifiable structure, such as an O-ring, but instead relates to the existence of a portion of a path that connects two other portions of the path while preventing leaking across those two other portions of the path.

The microchannels 142 and seals 146 can be configured to be used reversibly, which is to say that any one block 100 can be configured to be flipped, turned, or otherwise manipulated to be used with other adjacent blocks to form a path. A person skilled in the art will recognize other microfluidic components that can be used and/or formed in the modular blocks, including but not limited to those described further below. Some non-limiting examples of such components include tubing that is attached to an inlet or outlet of a block.

The modular blocks 100, 110, as well as other modular blocks (including baseplates) provided for in the present disclosure, can be formed from many different materials. Some non-limiting examples include polymers, thermoplastics, ABS, polycarbonate plastic, PTFE, PET, PEEK and elastomeric materials. It can be desirable to have the blocks be transparent so fluid flow can be more easily observed in the microfluidic system. Blocks may be made of different materials in a single system.

Figure 2:
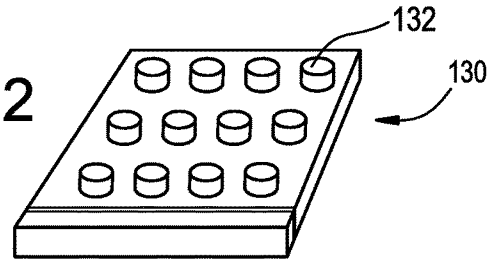
FIG. 2 is a perspective view of one exemplary embodiment of a baseplate.

The modular blocks 100, 110 can be formed into a microfluidic system on any sort of surface, but in exemplary embodiments a surface having precision locating features 120 can be useful in helping to maintain a location of a modular block. For example, a baseplate 130 having a plurality of precision locating features 120, such as precision locating protrusions 122, can be used to receive a plurality of blocks of the system. One exemplary baseplate is illustrated in FIG. 2. The baseplate 130 can itself be considered a modular block, and in some embodiments, such as a baseplate shown in FIG. 3A, a baseplate 130 can include precision locating posts (not shown) to allow the baseplates 130 themselves to be coupled to other blocks, including other baseplates. Baseplates 130 can have many different sizes, and are generally sized to have a microfluidic system disposed on it, or if the microfluidic system is rather large, it can be designed to have part of a microfluidic system disposed on it and used in conjunction with other adjacent baseplates. The adjacent baseplates 130 can be coupled together using a connecting block extending across the two adjacent baseplates, and/or by extending a modular block that is part of the microfluidic system across two adjacent baseplates. As described in further below, in some instances, a baseplate itself can be configured to have fluid flow through and/or across it. Further, although a baseplate is generally described above as being a first or base layer onto which systems are built, a person skilled in the art will recognize that in lieu of, or in addition to, one or more baseplates can be disposed above a microfluidic system while still achieving the same purpose, i.e., maintaining a location of modular blocks with respect to each other to provide for a secure, consistent microfluidic path.

It will be appreciated that modular bricks 100, 110, including baseplates 130, can be used in modular microfluidics as taught herein due to their dimensional consistency and their repeatability of positioning when mounted. Modular bricks 100, 110 can attach together at multiple points when each protrusion 122 on the top of one block nests within a mating feature (e.g., the post 124 and space 126 surrounding the post) on the bottom of a second block, and can be held together by a friction fit, an interference fit, and/or an elastic fit (a fit by which coupling is caused by elastic deformation of mating features and related friction, and can include, but is not limited to, a strict interference fit), among others. The fit can be between protrusions 122 and the post 124 and/or between protrusions 122 and inner surfaces of the sidewalls of the block 100. To attach two blocks to the same baseplate without interference, blocks have an outer dimension slightly smaller than the distance between two protrusions 122, so there is a small and uniform gap between blocks on the same plane. The blocks can be configured to expand slightly (<50 μm) when mounted but not enough to fill this gap. The size distribution of modular bricks that were tested in conjunction with the present disclosures (e.g., LEGO® modular blocks) was measured with a digital micrometer (Mitutoyo IP65, resolution 0.001 mm). These values were used to determine the size distribution of the narrow gaps that exist between bricks on a baseplate by comparing the brick dimension to the average distance between brick posts, which was consistently larger by approximately between about 100 μm to about 300 μm.

The position of a block 100 relative to the baseplate 130 when it is mounted can be determined by how it connects to multiple protrusions 132 in a process called elastic averaging. Elastic averaging is a measurement where a deviation in the positions of the protrusions from perfectly regular will be averaged out, in its ideal form causing random error to reduce with $1/\sqrt{N}$, for N protrusion-to-block connection points. Elastic averaging is demonstrated here using blocks with attachments where one block attaches to another via the interlocking of a series of protrusions 122 protruding from the surface of one block into a mating feature 124, 126 in a second block, as shown in FIG. 1C. In general, an elastically averaged contact is a mechanical contact in which multiple instances of an elastic (compliant) contact overconstrain the relative position of two pieces when mated (i.e., the number of contact points exceeds the degrees of freedom). Some non-limiting examples of elastically averaged contacts provided for in the present disclosure include protrusions 122, a post(s) 124, and sidewalls of the block 110. This has the effect of averaging out irregularity in the conformity of the contact points and so this averaging improves the accuracy and repeatability of the contact with a greater effect with more contact points. It will be appreciated that although blocks having the protrusion 122 and mating feature 124, 126 configuration on opposing faces are discussed herein, other shapes can enable elastically averaged contacts. For example, a linear extruded structure with a periodic rectangular, triangular, or rounded profile can mate with an independently selected linear extruded structure with a periodic profile, or a threaded screw can mate with a threaded hole.

Figure 1D:
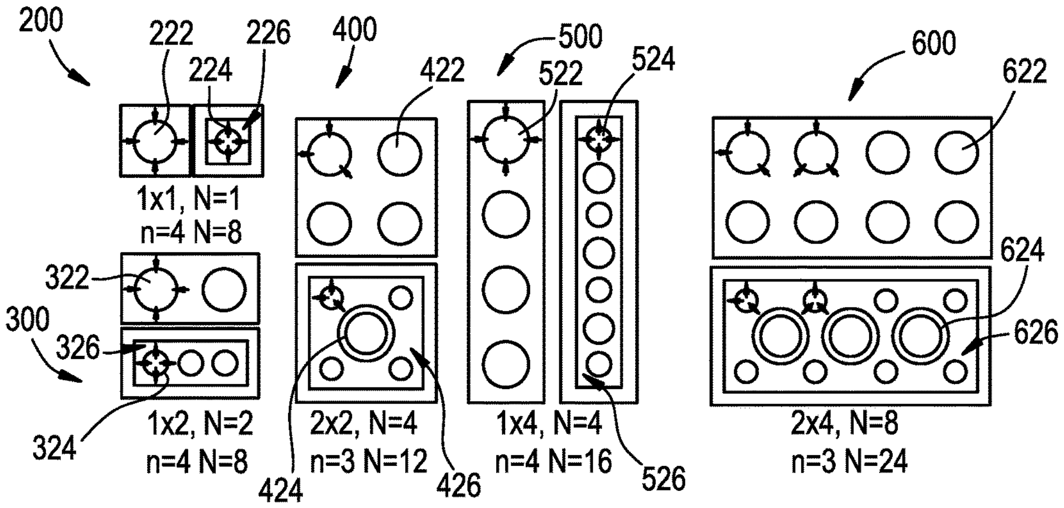
FIG. 1D provides respective top and bottom views of other exemplary modular bricks, including bricks having a 1×1, 1×2, 2×2, 1×4, and 2×4 configuration.

FIG. 1D illustrates locations of contact points for five commonly sized blocks 200, 300, 400, 500, 600, shown on the top (lighter) and bottom (darker) block surfaces, and once for each type of protrusion attachment.

The modular blocks can have a variety of alternative averaging geometries. A plurality of rods or pegs can be mated into a plurality of grooves or holes. In general, two or more compliant features can engage with one or more paired features for engagement where at least the compliant features are in a state of stress when mated, causing them to deform slightly (though perhaps an unmeasurable amount). At least one set of one or both of these types of features can be present on any one or more surface of a single component, including on the same surface. For example, the features can be presented in an array, or grid, along the top and bottom surfaces or can be presented circumferentially or can be presented in the center. In some embodiments, two surfaces with protrusions of the same spacing which are pressed together, and a structure where smaller protrusions fit into an array of larger protrusions.

Repeatability testing of mounting modular blocks on a baseplate 130 was performed to measure the gap spacing between blocks. The average spacing was found to be approximately 177 μm with a standard deviation of approximately 25 μm, varying slightly for different block sizes and with a much narrower distribution for each particular block size. The repeatability of block mounting, measured by removing and replacing the same block many times and measuring the edge position, was determined to be about 3 μm or less for all blocks with more than one post. When blocks were assembled on a baseplate with a third, top layer of blocks for additional constraint, repeatability was below about 1.4 μm for all blocks. Fluidic blocks with O-ring and sealing film retained similar repeatability of about 1.6 μm and about 1 μm for these two arrangements, respectively.

Modular blocks can have a micron-level repeatability because of their low size tolerance in fabrication and nanometer-scale surface roughness. For blocks of different size, instead of a dependence on $1/\sqrt{N}$, we find three regimes of repeatability. For blocks having a single post, which have rotational freedom, repeatability was upwards of about 25 μm. Two-to-four post blocks, repeatability was low and constant. As blocks increase in size, the variation tends to increase, which may be due to greater stress in the block-baseplate connection, making it increasingly more likely to have angular misalignment between block and baseplate. This can be a manifestation of Abbe error that is due mostly to the high stiffness of the post compared to the frictional resistance required to nest them within a square cage. Repeatability was found to be greater on thinner (thermoformed) baseplates due to their greater flexibility, and so only injection-molded pieces were used to build demonstration systems. The systems described herein pertain to the 1×2 and 2×2 block sizes due to more consistent gap size and lower repeatability compared to other blocks, though it will be appreciated that other systems can be used as well. In some embodiments, blocks can be fabricated using fused deposition modeling (FDM) and stereolithography (SLA) 3D-printing. Blocks of the present disclosure (inclusive of any film sealing microfluidic channels) attached to a baseplate, can thus align with consistent gap sizes approximately in a range of between about 0 μm and about 500 μm and/or with gap sizes having a standard deviation approximately in a range of between about 0.1 μm and about 100 μm, such as approximately between about 20 μm and about 50 μm.

Blocks can expand elastically when mounted due to the stress exerted by posts 124 on the baseplate 130, but not enough to completely fill the gaps in the blocks. When multiple protrusions 122 fit into multiple mating surfaces 124, 126, the compliant posts can each deform slightly, causing an elastic averaging of position that can reduce the error in position.

Figure 3A:
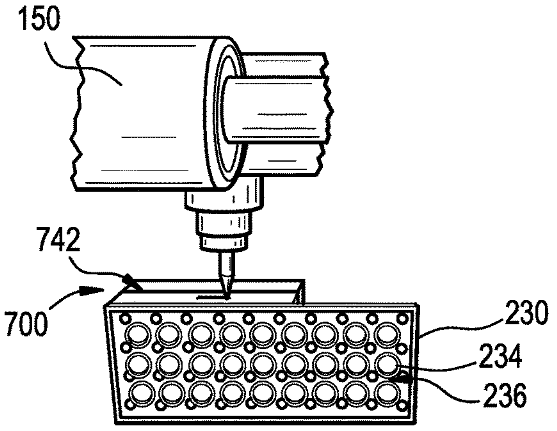
FIG. 3A is a perspective side view of one exemplary embodiment of a channel-formation device being used to form a channel in a modular block attached to a baseplate.
Figure 3B:
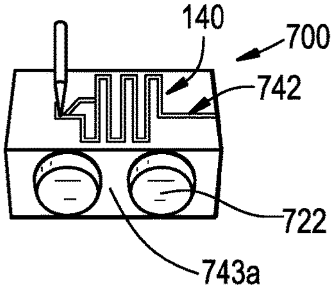
FIG. 3B is a detailed perspective top view of the modular block of FIG. 3A having a channel formed therein by a cutting tool.

Channel 742 can be fabricated in and/or on a modular block using a number of techniques known to those skilled in the art for forming channels in a surface (e.g., drilling, milling, additive manufacturing). FIG. 3A illustrates a modular brick attached to a baseplate 230, with the baseplate 230 having a plurality of precision locating protrusions (not visible) formed on its top surface (not visible) for purposes of mating with the block, and a plurality of precision locating posts 234. The milling machine 150 in the illustrated embodiment is a desktop, 3-axis micromill machine (e.g., Roland SRM-20) that uses endmill cutting tools to remove material from the block, although other tools, like a Performance Micro Tool carbide endmill or a scanning electron micrograph, can be used. As shown in FIG. 3B, channels 742 can be fabricated by micromilling one or more sides of the as-acquired/purchased/received modular block. The channels can be machined into one or more of the side faces of the blocks to create grooves or microchannels 742 with a generally rectangular profile, though grooves or microchannels of other geometries can also be formed, such as those with rounded or triangular profiles. The microchannels can optionally be cut around one or more corners of each block as well, and may pass through a wall of the block entirely where it can, for example, to fill a void inside a block or continue its path on the other surface. In some, non-limiting embodiments, the microchannels can have a width approximately in the range of about 150 μm to about 500 μm, a depth approximately in the range of about 50 μm to about 500 μm, an edge radius approximately in the range of about 5 μm to about 10 μm, and a surface roughness of about 0.90 μm. The overall shape or design of the microchannel 742 can be any configuration, including those illustrated and/or described herein or otherwise known to those skilled in the art. In the illustrated embodiment, the design is a rectangular-shaped sine wave through which fluid can be passed, which elongates the path that can be made on a small face, facilitating the extent of mixing of fluids via molecular diffusion. A person skilled in the art will recognize that the size, shape, and dimensions of the microchannels can depend on a variety of factors, including but not limited to the size, shape, and configuration of the block in which the microchannels are being formed, and the desired use of the microfluidic block. The parameters to be milled can be determined via precision apparatuses such as software for best surface finish and tool life. In some embodiments, the path can be entirely within the block, as can be achieved, for example, by 3D-printing, drilling a microscale fluidic path through an internal volume of an existing block, or molding the block to contain the path.

The milled microchannels can have its open-face covered with a thin film or cover, such as an adhesive polyethylene film (e.g., 110 μm thickness, ThermalSeal) or sealant. The film can help keep fluid in the microchannels. The film can be pierced with a standard razor at fluid inlet and/or outlet points. The apertures formed as inlet and/or outlet points can be sized such that capillary pressure retains fluid inside the channels when a block is pulled from a system and apertures are exposed to air. This can be true even for embodiments that do not include a cover. In other words, the design of the channels (e.g., its size, the cover, and/or the surface tension, etc.) can be such that as the block is repositioned and/or reoriented with respect to a baseplate or other component of the system (i.e., it is freely moved), the fluid is retained or otherwise held in the microchannel. The sealant can be applied to the channel and the corners of the block for multi-side sealing. In some embodiments, the microchannels can be coated with a layer of cyanoacrylate adhesive between the film and the block surface. In addition to an adhesive film to enclose the groove, or microchannel, the groove can be closed or contained by other technologies. For example, the groove can be enclosed by sealing to one or more adjacent block faces with compression. Alternatively, a film can be welded or shrink wrapped onto a brick. In some embodiments, fluid can flow through a channel with a face open to the environment, being contained by surface properties of the channel or outer block face. In some embodiments, the fluid can be contained by channel geometry and dimensions influencing the effect of surface tension and capillary action.

Other methods of modifying the surface of the modular blocks can be used, including but not limited to laser ablation, hot embossing, etching, and other techniques known to those skilled in the art. Factors including but not limited to processing speed, feature resolution, ability to modify the design, material compatibility (plastic), surface roughness, and effects on opacity can impact the choice.

After fabrication, channels can be smoothed by flowing a stream of acetone through a milled block to soften and smooth the channels. In some embodiments, it may be desirable to change the wettability of a surface made for microfluidics, such as to control the behavior of emulsions, or for separations. To create a solvent-resistant barrier, bricks can be coated with a 4 μm layer of Parylene-C (Di-chloro-di-p-xylylene; Galentis S.P.A.), which is transparent and used to coat, for example, implanted medical devices that hold electronics because it forms a resistant, nonporous barrier to water and a wide range of organic solvents. This coating can successfully protected blocks from a variety of organic solvents that can discolor and scar regular bricks (acetonitrile, dimethyl sulfoxide, tetrahydrofuran, toluene, dichloromethane, N,N-Diisopropylethylamine, hexanes, and dimethylformamide). Alternative fabrication methods for modular blocks include three-dimensional printing (e.g., additive manufacturing) and folding a thin plastic insert between blocks in a network. The modularity of the design can allow a similar interconnect to be made for any existing system, such as to plug a polydimethylsiloxane (PDMS) or glass chip into a mostly preexisting modular block system when particularly small or smooth features are required in a subsection of the flow path. In three-dimensional printing, blocks can be printed using processes such as stereolithography and fused deposition modeling, enabling alternate geometries than may be easier to print than to mill, e.g., larger channels and channels going through the body, i.e., the volume, of the blocks. The use of three-dimensional printing can allow for the elimination of dead space and sharp changes in geometry.

Figure 4B:
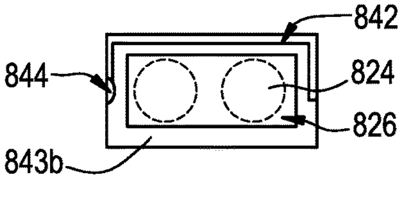
FIG. 4B is a top cross-sectional view of the modular block of FIG. 4A taken along the line B-B.
Figure 4D:
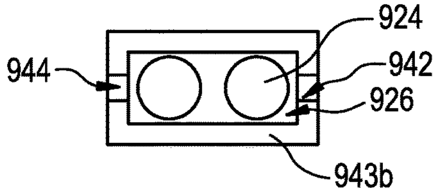

As shown in FIGS. 4A and 4B, the microchannels 842 can be formed by forming the channel(s) in a surface or face 841*a,* 841*b* of a block 800, or, as shown in FIGS. 4C and 4D, by forming channel(s) 942 through an internal volume of a block 900. The internal path can be of any size and trajectory within and around the block, and combinations of internal and surface pathways (either serial, parallel, or branched networks) are possible. An internal fluid path can be created by attaching tubing to the surface of blocks using the same elastically averaging contacts used to connect blocks together. The channels 842 formed in the surface or face 841*a,* 841*b* of the block 800 is an illustration of a block having its microfluidic path substantially disposed along an outer surface of the block, while the channel(s) 942 formed through the internal volume of the block 900 is an illustration of a block having it microfluidic path substantially disposed through the internal volume of the block. While an entire portion of a path does not need to be formed "on an outer surface" or "through an internal volume" to constitute a substantial portion of the path being disposed as such, a person skilled in the art will recognize how much of the path should be formed in such a manner to be considered "substantial." It should be at least greater than 50% of all channels formed for purposes of fluid transport, and in some instance at least 60% or at least 70%.

FIGS. 5A, 5C, 5E, and 5G illustrate exemplary, non-limiting microchannel geometries formed in modular blocks 900, 1000, 1100, 1200 using a milling process, and FIGS. 5B, 5D, 5F, and 5H illustrate detailed micrographs of portions of the channels 942, 1042, 1142, 1242 in FIGS. 5A, 5C, 5E, and 5G, respectively. Such geometries can also be created using channel-formation processes described herein or otherwise known to those skilled in the art. As shown, the paths of the channels 942, 1042, 1142, 1242 formed in any block 900, 1000, 1100, 1200 can vary, and can depend, at least in part, on the desired outcome or purpose of channel formed in that particular block, and the configurations of any other blocks with which the block is being used. Some non-limiting, exemplary purposes of the channels include generating droplets, splitting a fluid stream, combining two fluid streams and mixing them, performing advective mixing, and controlling a central flow.

The microchannel 942 formed in a modular block that can include protrusions 922 on a top surface 943*a* thereof as shown in FIGS. 5A and 5B is similar to the microchannel 142 of the block of FIGS. 1A and 1B. As shown it includes a microchannel 942 extending the length of an entire face 941*b* of the block 900 and an outlet aperture 944*b* disposed in a face 941*c* of the block the is adjacent and substantially perpendicular to the first face. The micrograph of a portion of the microchannel 942 provided for in FIG. 5B illustrates that the channel 942 is substantially linear and has a substantially uniform width. The face having the outlet aperture 944*b* also includes a portion of the microchannel. A face (not visible) opposed to the face having the outlet aperture 944*b* can include a portion of the microchannel, as well as an inlet aperture (not visible). Seals can be disposed in the inlet and outlet apertures, and the microchannel 942 can be configured to allow fluid to flow from the inlet aperture, through the channel 942, and to the outlet aperture 944*b*.

A modular block 1000 that can includes protrusions 1022 on a top surface 1043*a* thereof of FIGS. 5C and 5D include a microchannel 1042 configured to provide for a focused flow. The microchannel 1042 extends the length of an entire face 1041*b* of the block 1000, with at least three branches being formed on the face. More particularly, a first, middle branch 1042A extends substantially linearly along the entire length of the block, while both a second, top branch 1042B and a third, bottom branch 1042C extend only a portion of the length of the face, with those portions being substantially parallel to the second branch until terminal ends of the second and third branches. The terminal ends of the second 1042B and third branches 1042C converge towards the second branch and meet at a junction 1045, which allows for focused flow. The junction 1045 is illustrated by the micrograph of a portion of the microchannel provided for in FIG. 5D. An angle $\theta_2$ formed by the first branch and the second branch and an angle $\theta_1$ formed by the first branch and the third branch can be approximately in the range of about 5 degrees to about 70 degrees, although other configurations are possible. The angles $\theta_1$ and $\theta_2$ can be similar or different. The paths can also join in a curved path, such as with a hyperbolic geometry.

In the illustrated embodiment, a length of the second and third branches 1042B, 1042C is approximately half of the length of the face 1041*b,* although other lengths are possible. Further, although the lengths of the second and third branches 1042B, 1042C are illustrated as being about the same, they can have different lengths and can feed into the first branch 1042A at different locations along the length of the first branch 1042A. Likewise, although the second 1042B and third branches 1042C are illustrated as being substantially parallel to the first branch 1042A pre-junction, they do not have to be configured as such. They can extend at any angle with respect to the first branch and/or with respect to the surface of the block itself. Still further, a person skilled in the art will recognize any combination and configuration of microchannels and/or branches can be used to create any number of microfluidic path configurations, including, by way of non-limiting example, having two branches converge into one branch, before that one branch then converges with a third branch. Although not visible, the block can include inlet and outlet apertures on respective opposed walls that are adjacent and substantially perpendicular to the face, with the microchannel 1042 being formed in such walls to allow communication of the microchannel 1042 on the face with the inlet and outlet apertures.

FIGS. 5E and 5F provide for a modular block 1100 that can include protrusions 1122 on a top surface 1143*a* thereof that is configured to allow for the flow of fluid back-and-forth across two planes. While in the previous embodiments fluid is designed to flow across three planes (i.e., the portions of the microchannels in the first, second, and third walls), the illustrated paths did not generally provide for any back-and-forth action across the two planes 1141*b,* 1141*c.* The embodiment illustrated in FIGS. 5E and 5F, however, illustrates that such a configuration is possible. The configuration thus allows for advective mixing of fluid passed through the microchannel 1142.

As shown, a microchannel 1142 is formed in a surface 1142*b* of a wall of the modular block 1100. The microchannel 1142 is angled with respect to a bottom surface of the block 1100, forming an angle α as shown. The angle α can be approximately in the range of about 5 degrees to about 70 degrees. The microchannel 1142 then forms a series of back-and-forth passes that extend from the side to an adjacent, substantially perpendicular second side of the blocks 1142. In the illustrated embodiment, seven passes are made back-and-forth around a corner 1147 of the block so that fluid can flow back-and-forth across the two sides. One exemplary bend formed on one of the walls included in the back-and-forth section is illustrated in the micrograph of FIG. 5F. This back-and-forth movement across faces in different planes, and thus forming a partially non-planar three-dimensional path, is referred to herein as an advective mixing section of a microfluidic path. An advective mixing section, allows for advective mixing, which enhances the speed of mixing beyond what is possible with diffusive mixing typical of paths in a single plane, allowing a final microfluidic system to be more compact.

Although the illustrated embodiment provides for a microchannel 1142 that is angled with respect to the bottom surface of the block 1100 prior to reaching the advective mixing section, in other embodiments this portion of the microchannel 1142 can be substantially parallel to the bottom surface. As shown, the advective mixing section can terminate near an outlet aperture 1144*b* formed in the wall 1141*c*. Alternatively, it can extend to additional microchannels 1142 formed in the wall either prior to reaching or in lieu of an outlet aperture 1144*b*. One or more inlet apertures (not visible) can be provided as well, for example on an opposed wall (not visible) to the wall having the outlet aperture.

A modular block 1200 that can include protrusions 1222 on a top surface 1243*a* thereof, as illustrated in FIGS. 5G and 5H, can include a microchannel 1242 that is similar to the microchannel 1242 of the block of FIGS. 5A and 5B. As shown, it includes a microchannel 1242 extending the length of an entire face 1241*b* of a transparent block 1200 and an outlet aperture 1244*b* disposed in a face 1241*c* of the block the is adjacent and substantially perpendicular to the first face. The micrograph of a portion of the microchannel 1242 provided for in FIG. 5H illustrates that the channel 1242 has a substantially linear portion and then expands in width. The face 1241*c* having the outlet aperture 1244*b* also includes a portion of the microchannel 1242. A face 1241*a* that is opposed to the face having the outlet aperture 1244*b* can include a portion of the microchannel 1242, as well as an inlet aperture (not shown). Seals can be disposed in the inlet and outlet apertures, and the microchannel 1242 can be configured to allow fluid to flow from the inlet aperture, through the channel 1242, and to the outlet aperture 1244*b*. One advantage of this design is that the transparent walls 1241*a*, 1241*b*, 1241*c* of this modular block can allow the channel 142, and fluid traveling therein, to be visible from multiple vantage points in the system.

The examples provided for in FIGS. 5A-5H are just some exemplary embodiments of modular block types that can be used in conjunction with the microfluidic systems, devices, and methods provided for in the present disclosure. Additional, non-limiting examples of modular block types having various configurations for use in microfluidic systems, devices, and methods provided for herein are provided in FIGS. 6A-6P. More particularly, FIGS. 6A-6I provide for various types of "fluidic blocks" or "fluidic bricks," meaning they illustrate some non-limiting examples of designs that can be used to pass fluid across and/or through a modular block, while FIGS. 6J-6P provide for various types of "active blocks" or "active bricks," meaning they illustrate some non-limiting examples of designs that can be used to perform some sort of function on fluid flowing through a microfluidic path in conjunction with the disclosures provided in the present disclosure (sometimes referred to herein as an active or sensing function). Generally, as used herein, a "type" of block is a block that performs a particular function and/or has a particular design. Different block types can have different shapes, sizes, and configurations. For example, a type of block may be a "heater block," and that block can have a variety of shapes, sizes, and configurations. The illustrations and related descriptions of sizes and shapes of modular blocks is in no way limiting.

Notably, to the extent any of the block types provided for herein, including but not limited to those illustrated in FIGS. 5A-5H and 6A-6O, have a particular size (e.g., 2×1, 2×2, etc.) or shape (e.g., rectangular prism, cylindrical, etc.), such size and shape is generally not limiting. A person skilled in the art will understand how the functions associated with a particular block type can be adapted for use in blocks of other sizes and shapes. Generally, the blocks provided for in the present disclosure can include one or more precision locating features (e.g., protrusions, posts, etc.) that can be used to couple the modular blocks to a baseplate and/or other blocks. They are often illustrated in many of the provided embodiments, but are not necessarily described each time for brevity. A person skilled in the art will understand there may be other features that can be incorporated into or other associated with the modular blocks to allow them be precisely located at a particular desired position.

FIG. 6A provides for a modular block 1300 having an inlet 1344*a*. The inlet can be used in conjunction with, or in lieu of, an inlet aperture. Notably, any block can have one or more inlets or inlet apertures, and likewise, any number of outlets or outlet apertures. In the illustrated embodiment, a flexible tube 1360 (e.g., ⅛" outer diameter) is press-fit into a hole disposed in the modular block 1300. The hole(s) can be pre-formed in the block 1300, it can be formed in the block using one of the microfluidic component creation techniques provided for herein (e.g., milling, drilling, etc.), or it can be formed as part of a full block production process (e.g., during three-dimensional printing). In the illustrated embodiment, the inlet 1344*a* is disposed through a precision locating protrusion 1322 formed on a top surface 1343*a* of the modular block 1300, and thus the tube 1360 extends from the top surface 1343*a*. The inlet 1344*a* may also have an opening to accept fluid from a standard laboratory container, such as a beaker, test tube, or microcentrifuge tube. The tube can be replaceable. Further, although described as an inlet, the illustrated inlet 1344*a* can also be an outlet and/or a block can include an inlet and an outlet having the described configuration, or different configurations.

More specifically related to tubing that can be used in conjunction with an inlet and/or outlet, tubing can mate with one or more fluid inlets or outlets of one or more microfluidic blocks. In some embodiments, the tubing can also attach to the surface of the block 1300 using the same precision locating features used to connect blocks to blocks and/or baseplates. In some embodiments, the tubing can generally have the same, or slightly smaller, outer diameter as the distance between two adjacent protrusions. In some embodiments, the pathway within a microfluidic block can comprise a microfluidic valve, such as a microchannel that is closed in a first position and opened upon applying or removing a deformation force on the block or system.

FIG. 6B provides for a modular block 1400 similar to the block of FIG. 5A, with the difference being that the inlet 1444*a* is more rigid. As shown, the inlet is associated with a precision locating protrusion 1422 formed on a top surface 1443*a* of the modular block, and thus the inlet 1444*a* extends from the top surface. A hole (not visible) is formed in the protrusion 1422 to allow for fluid communication with a microfluidic path of the block 1400. The illustrated inlet 1444*a* is a generally rigid tube 1460 having a first portion 1460*a* extending linearly away from the top surface such that a central axis $L_1$ of the first portion of the tube is substantially aligned with a central axis $L_2$ of the precision locating protrusion. A second portion 1460*b* of the generally rigid tube 1460 extends substantially at a 90 degree angle from the first portion 1460*a*. In the illustrated embodiment, the second portion 1460*b* terminates a distance beyond a length of the modular block, although it does not necessarily have to terminate beyond that length.

FIG. 6C provides for a modular block 1500 having a microfluidic path 1542 configured to operate to produce droplets, also referred to as a droplet block. As shown, the microchannel 1542 that is part of the path includes a first branch 1542A that extends across a length of the block 1500 and a second branch 1542B that extends substantially parallel to the first branch 1542A for a first portion thereof before turning approximately 90 degrees towards the first branch to intersect the first branch, also approximately at a 90 degree angle. This forms a T-junction 1545, resulting in droplet creation. More particularly, where the two paths come together at the T-junction 1545, it can cause one fluid to pinch-off into another fluid stream, thus forming droplets of a regular size Like all of the other illustrated embodiments, the length of the second branch 1542B, the location of the T-junction 1545, etc., can vary, and thus the illustrated embodiments are by no means limiting.

FIG. 6D provides for a modular block 1600 having a microfluidic path 1642 configured to split a fluid disposed therein, also referred to as a split block. As shown, the microchannel 1642 formed in a wall 1641*b* starts as a single branch 1642A before breaking into two branches 1642B, 1642C. Each of the two branches 1642B, 1642C can extend towards and around a corner 1647 of the block 1600 to a wall 1641*c* that is adjacent and substantially perpendicular to the wall 1641*b*, terminating at respective outlet apertures (not visible). In some embodiments, the branches 1642B, 1642C can later converge into a single branch, or split into additional branches, any of which may or may not be associated with an outlet or outlet aperture.

FIG. 6E provides for a modular block 1700 having a microfluidic path 1742 that allows for fluids to be combined and mixed, also referred to as a combined-and-mix block. As shown, a microchannel 1742 formed in a wall 1741*b* starts as first and second branches 1742A, 1742B before meeting at a junction 1745 to form a single, third branch 1742C. The third branch 1742C is then configured to have a rectangular-shaped sine wave formation that can be used to mix fluids that enter the microchannel 1742 through the first and second branches 1742A, 1742B. Like many of the other embodiments, inlet and outlet apertures (not visible) can be provided in other walls, such as those that are adjacent and substantially perpendicular to the wall (such walls not being visible), to allow fluid to enter and exit the modular block 1700, for instance to flow to an adjacent block of the system.

FIG. 6F provides for a modular block 1800 configured to incubate, also referred to as an incubation block. As shown, the block 1800 includes an extended area 1862 for fluid to collect. When the fluid is in the extended area 1862, it can allow the block 1800 (or system as a whole) to increase the residence time of fluid in a particular state (e.g., light exposure, temperature, etc.) for incubation.

FIG. 6G provides for a modular block 1900 configured to include a valve 1964 to assist in controlling the flow of fluid across and/or through the block 1900, also referred to as a valve block. As shown, a microchannel 1942 can extend through a volume of the block from a first wall 1941*a* to a second opposed wall 1941*c*. The microchannel 1942 can include a valve 1964, such as a one-way direction valve, that can be operated using techniques known to those skilled in the art to selectively open and close the valve 1964 to allow and prevent, respectively, the flow of fluid across the valve and path. In the illustrated embodiment, the valve 1964 is a floating ball valve in which a floating ball is pressed against a grate when fluid comes from a second side 1965*b* of the microchannel 1942, allowing fluid to go around it, and is pressed against an opening when fluid comes from a first side 1965*a* of the microchannel 1942, thus blocking the fluid. A person skilled in the art will recognize many other valve configurations, including multiple valve configurations, that can be incorporated into fluid paths formed through a volume of a modular block 1900, and/or formed in an outer surface of a modular block, without departing from the spirit of the present disclosure. It will be appreciated that valves can be used to modulate flow. In some embodiments, valves can have a flexible structure and can regulate flow via pneumatic action, among other methods known to a person skilled in the art.

FIG. 6H provides for a first of a number of exemplary active and/or sensing blocks or bricks. More particularly, it provides for a modular block 2000 configured to include a pump 2066 to assist in driving fluid flow across a microfluidic path 2042 formed in one or more modular blocks, e.g., a system of modular blocks. The pump 2066 can be configured to operate in a variety of ways, but in some instances it can apply a continuous or discrete displacement to a fluid. As shown, the block 2000 can be made of two components, portions, or blocks. A first portion 2002 can form the top surface of the block and can include a location where a fluid or powder can be added to a reservoir, for instance through a top surface of the resulting block. A second portion 2004 can form the bottom surface of the block. When the two portions are connected and inverted, the block 2000 allows mixing of two chemical species to generate propulsion via chemical reaction, which can exit the block via a hole 2067 formed in the second portion. Potential chemical reactions for this type or arrangement can include the generation of carbon dioxide gas from acetic acid and sodium bicarbonate, the decomposition of hydrogen peroxide by *s. cerevisiae* to generate oxygen gas and water, a combustion reaction, and decomposition of sodium azide into sodium metal and nitrogen gas, among others. In each instance, the resulting reaction causes an increase of volume of material within the block, thus causing fluid to leave the block and provide thrust for propulsion of fluid through the microfluidic path 2042.

FIG. 6I provides for a modular block 2100 having one or more sorting features (e.g., split paths), also referred to as a sorting blocks. A person skilled in the art will appreciate that some of the above-described embodiments, as well as other embodiments provided for herein, can also provide the ability to sort. In many sorting blocks, such as the one illustrated, flow can be driven by a pressure gradient, due, for example, to gravity. In the illustrated embodiment, a lower block 2110 can have one untreated channel 2142A and one channel 2142B treated with acetone to make it more hydrophobic. This can create a filtering system so that aqueous fluid preferentially goes along the more hydrophilic path. This can be seen, for example, in the left image by a shaded droplet collecting below only the channel 2142A. In a variation, an inertial sorting block can have a fluid path with geometry that allows it to separate two or more fluids or a suspended material(s) due to induced inertial effects in the fluid. This, for example, can be a circular or spiral pathway that causes the flow to separate in the direction perpendicular to the primary flow velocity (see FIG. 16A and related description below for further detail of one such example).

FIG. 6J provides for a modular block 2200 having a filter 2270, also referred to as a filter block. As shown, the filter block includes a porous material 2272 (e.g., sand) disposed within a body of the block. Fluid can be pumped through the body to be filtered through the porous material 2272. This can be particularly useful for filtration of biological material or molecules whose mobility is a function of their size, and/or that are prone to adsorption on the surface of the porous material.

FIG. 6K provides for a modular block 2300 that is considered to be acoustic, also referred to as an acoustic block. As shown, the acoustic block 2300 has an electromechanical transducer 2374, such as a piezoelectric device, mounted to a wall in the block to provide vibration to the fluid. This can, in turn, cause material to collect at specific points and/or to mix. This schematic image shows matter suspended in the fluid in the block focusing to the center of a channel 2342 in a flow occurring in a direction R, with a piezoelectric transducer (PZT). Multiple transducers may be positioned with respect to the block surfaces to control the field intensity and pattern within the fluid pathways.

FIG. 6L provides for a modular block 2400 having an IR sensor 2476, also referred to as an IR sensor block. The position of the IR sensor 2476 on the block can be made to be aligned with some section of flow in that block or another block so that the sensor 2476 can detect the level of light passing through the fluid. Optionally, a second block or element can be placed on the opposing side of the fluid path so that the fluid can be illuminated, such as by a fiber optic cable placed in a hole on a second block for positioning. The sensor may, for instance, be used to measure the absorptivity of a passing fluid (which in turn can be used, for example, to calculate the concentration of a dissolved substance), or to mark the passage of droplets or suspended material that have different optical properties than the suspending fluid.

FIG. 6M provides for a modular block 2500 having a capsule 2578, also referred to as a capsule block. The capsule block 2500 can have a larger internal (or surface) cavity 2551 that can hold a volume of fluid. This can, for example, be used to collect an intermediate or final output of a block network, or to provide fluid for initial input into a system.

FIG. 6N provides for a modular block 2600 having a heater 2680, also referred to as a heater block. The heater block 2600 can include one or more elements or components designed to provide heat to a system, for instance, to help heat fluid passing through a microfluidic path. In the illustrated embodiment, the heating element 2680 is a resistive heater having a patterned conductive path through which an electrical current is provided. In other embodiments, the heating element can be a Peltier cell. Optionally, a temperature regulation element or component, such as a thermocouple, can be used to provide feedback for purposes of maintaining the system at a desired temperature. The heater block 2600 can be positioned in proximity to a fluid path to provide desired heat to fluid passing through the path.

FIGS. 6O and 6P provide for a modular block 2700 having a magnet 2782, also referred to as a magnet or magnetic block. As shown, the block 2700 is substantially cubic in shape and can include one or more magnets 2782 associated with one or more sides of the cubic block. In the illustrated embodiment, there are four magnets on each of the six faces or sides of the cubic block, although not all sides are visible. A person skilled in the art will recognize many different types, sizes, and configurations of magnets that can be used depending, at least in part, on the size, shape, and configuration of the block with which the magnet is used, the desired outcome with respect to the fluid that is to be achieved by using a magnet, etc. In some embodiments, a magnetic block 2782 can be configured to apply a magnetic field to a fluid path by holding and positioning one or more permanent or electro-magnets adjacent to the fluid path. The illustrated magnetic block 2700 has a bolt 2783 for precisely locating the magnet 2782 within the block, allowing control of the strength of the magnetic field induced on a nearby fluid path.

FIG. 6Q provides for a camera 2753. The camera can be disposed on its own block, or otherwise associated with any block of a microfluidic system. The illustrated camera has a cylindrical shape, although the camera can have any shape. The camera can be used in conjunction with making any number of measurements related to fluid flowing through a microfluidic path. For example, the camera can record the passage of fluid to measure the speed of flow. In some embodiments, a microscope can be used in addition to, or in lieu of, a camera to analyze and observe passage of fluid through the system.

In another embodiment, an adjustment block can be designed to manipulate flow patterns of fluid within a microfluidic system that includes modular blocks. The adjustment block can be configured to alter fluid resistance (measured as the pressure drop per flow rate), residence or passage time of a fluid, and circuit analog features like capacitance or inductance. For example, a capacitance block 5900, as shown in FIG. 6R, can have an elastic segment that expands until it reaches a pressure capacity, or has a cavity that fluid fills before it continues on the path. In some embodiments, a control block 5500, as discussed below in relation to FIGS. 17A-17C, can include channels that can be configured to adjust resistance of fluid flow therein by adjusting channel width. It will be appreciated that channels having larger width have lower resistance, and vice versa.

It will be appreciated that many other different block configurations are possible, for instance by combining some of the features described herein, expanding on some of the features described herein (e.g., forming additional microchannels in one or more surfaces of a block and/or through a volume of the block), and/or using other techniques for forming microfluidic components known to those skilled in the art without departing from the spirit of the present disclosure. The types of blocks described herein are by no means exhaustive.

FIGS. 7A-7B illustrate placement of a seal, such as an O-ring 2846, between two modular blocks to seal fluid within associated microfluidic channels and prevent leaking. In the illustrated embodiment, the sealing film was cut through in two locations to provide apertures for fluid. The inlet 2844*a* and/or outlet side 2844*b* of each block 2800 can be configured to provide an O-ring 2846 fit into a circular O-ring seat 2848 that has been milled into the block. The O-rings can enable block-block interfaces to reversibly seal upon assembly without additional steps or hardware. The mating of individual blocks 2800 allows devices to be fabricated and assembled quickly, and complex networks (analogous to fluidic circuits) can be made by interconnecting these basic elements.

As shown in FIG. 7A, two O-rings 2846 can be placed in an O-ring junction 2845 between modular blocks, though it will be appreciated that one or three or more O-rings can be used. The O-ring junction 2845 is the total distance between two modular blocks $\sigma_{gap}$, which can be calculated as the difference between the sum of a milled hole $\sigma_{mill}$, and native block gap size $\sigma_{gap}$, and plastic film $\sigma_{tape}$. The reliability of sealing depends on the compression two surfaces exert on an O-ring 2846, which for a soft O-ring depends on the space between them. An O-ring is sealed in the O-ring junction 2845 between blocks by compressing an O-ring 2846 a given amount within the gap space between the blocks 2800. It will be appreciated that O-ring sizes can vary based on the width of the channel, the space between blocks, and other factors.

FIG. 7B shows a chart that measures the maximum fluid pressure that the O-ring seal can hold, versus compression. In some embodiments that were tested, the O-ring began to seal in the range of when compression was high enough to provide a complete physical barrier between the two block faces by filling in scratches left by milling (10% compression) and until compression was so high that the O-ring extruded out of its seat (50% compression). In the illustrated embodiment, a rate of 100% sealing was observed at the O-ring junction 2845 when the O-ring 2846 was in place within this range.

Some embodiments can include one or more seals, such as a compressible seal, configured to be compressed between two surfaces such that it joins apertures of two adjacent blocks to create a contiguous fluid path. The sealing pressure can be at least about 1 psi, such as at least about 5 psi, or at least about 30 psi. In some embodiments, EPDM O-rings with durometer 70 A and dash size 001-½ can provide a pressure capacity of at least about 0.43 psi/10 μm compression. or at least 130 psi at 30% axial compression.

Alternatives to O-rings exist for sealing fluid between bricks to prevent leakage. In some embodiments, short segments of Tygon tubing as used in inlet bricks, and thin layers of punctured PDMS or gasket material can be used. In some embodiments, EPDM rubber can be used do its resistance to the chosen working fluids (water and silicone oil). In some embodiments, O-ring materials including Kalrez, PTFE, and FEP would be suitable for greater chemical compatibility, however, the O-ring seat would need to be redesigned to accommodate the higher stiffness of these materials.

In some embodiments, the blocks can be sealed by solvent or thermal welding of a plastic cover instead of the adhesive film on the surface to give a higher pressure capacity. In solvent welding using acetone, a thin layer of ABS or polycarbonate was able to seal one surface of bricks. In some embodiments, a cover can be a second block pushed up against the block for which a cover is sought. A person skilled in the art, in view of the present disclosure, will recognize other ways by which channels and/or inlet/outlet apertures in adjacent blocks can be sealed to prevent fluid leaking when passing from one block to another.

FIGS. 8A-8S illustrate non-limiting examples of alternate geometries for blocks having precision locating features that include elastically averaged connections. Although the illustrated embodiments do not generally illustrate microfluidic elements such as channels and seals, a person skilled in the art will recognize that any of the blocks illustrated in FIGS. 8A-8S can have any number of microfluidic elements associated therewith without departing from the spirit of the present disclosure. In some embodiments, such as those provided in FIGS. 8A-8C, a variety of extruded linear shapes form features that enable elastically averaged contacts. As shown in FIG. 8A, the top block 2902 can include one or more precision locating protrusions 2922 having a rectangular or square cross-sectional shape located on its bottom surface, and the bottom block 2904 can include complementary-shaped precision locating mating features 2924 that include compliant walls and one or more receiving opening on its top surface such that the protrusions 2922 of the top block 2902 can be removably and replaceably coupled to the mating features 2924 of the bottom block 2904. In the illustrated embodiment, a shape of the compliant walls and opening of the bottom block 2904 is also of a rectangular or square cross-sectional shape, although the shapes do not necessarily have to be the same as the bottom surface of the top block to be complementary. FIGS. 8B and 8C illustrate a similarly constructed top block 3002 and bottom block 3004, with the top block precision locating protrusions 3022 having a triangular cross-sectional shape located on is bottom surface. A top surface of bottom block 3004 can include complementary-shaped precision locating features 3024 that include compliant walls and receiving opening on its top surface such that the protrusions 3022 of the top block 3002 can be removably and replaceably coupled to the mating features 3024 of the bottom block 3004, as shown in FIG. 8C. In the illustrated embodiment, a shape of the compliant walls and openings of the bottom block are of a rectangular or square cross-sectional shape, thus highlighting the fact that the precision locating features on two blocks can be differently shaped while still providing for a secure removable and replaceable coupling or mating between two blocks.

FIG. 8D provides a block 3100 having multiple types of precision locating features, such as protrusions 3122 and openings 3124 to receive complementary mating surfaces therein, the protrusions and opening being disposed on a same wall 3141*a* of the modular block 3100. As shown, a first wall 3141*a* includes two precision locating protrusions 3122 and precision locating opening 3124 for receiving mating features from an adjacent modular block, while a second wall 3141*c* that is opposed to, i.e., facing, the first wall 3141*a* can include at least one precision locating protrusion 3122 disposed substantially opposed to the opening 3124.

FIG. 8E provides a first modular block, sometimes referred to as a base block 3202, having one or more precision locating posts or rods 3222 extending from a top surface 3243*a* of the block 3200, substantially perpendicular to a length of the block 3202. As shown, a length of some of the posts 3222 can be at least half as long as a length of the block 3202, and the lengths of the posts 3222 do not have to be the same (although they can be if desired). Like the other provided for embodiments, lengths, locations, and numbers of posts can vary without departing from the spirit of the present disclosure. As shown, the posts 3222 are configured to receive a second modular block 3204, or series of blocks, with openings 3224 that are complementary in size and shape to the rods, and thus can slide onto the base 3202. In some embodiments, a shape of the openings 3224 in the second modular block 3204 can be such that the a position of the second block 3204 with respect to the first block 3202 can be maintained against some reasonable amount of force. As with many of the embodiments provided for herein, a person skilled in the art will understand an approximate amount of force that would be necessary to be applied to disconnect the second block 3204 from the first block 3202.

FIGS. 8F and 8G provide a modular block 3300 having a generally cylindrical shape with a cannulated or hollow center 3249 and precision locating features 3322 disposed on both ends. The precision locating features 3322 can be configured to mate with other similarly-shaped blocks, and/or with other types of blocks. In the illustrated embodiment, a plurality of protrusions 3322 are formed on a top surface 3243*a* of the block and a plurality of complementary bores 3324 are formed in a bottom surface 3243*b* of the blocks.

FIGS. 8H and 8I provide for two modular blocks 3402, 3404 each including precision locating protrusions 3422 formed on respective top surfaces 3443*a*. The size, shape, and spacing of the protrusions 3422 can be such that protrusions from one block can be disposed in gaps 3424 between protrusions 3422 of the other block to mate the two blocks 3402, 3404 together, such as shown in FIG. 8I.

FIGS. 8J and 8K provide for two modular blocks 3502, 3504 that include complementary precision locating features 3522. A first block 3502 includes a precision locating post 3522 extending from a top surface 3543*a*, and a second block 3504 includes a precision locating cylinder 3524 extending from a top surface 3543*c*, the cylinder being cannulated such that a bore extends therethrough and is adapted to receive the precision locating post 3522. As shown in FIG. 8K, disposed within the bore of the cylinder 3524 can be can be a receiving opening having walls configured to engage the precision locating post 3522 (e.g., by an interference fit), so as to removably and replaceably couple the first modular block 3502 to the second modular block 3504.

FIGS. 8L, 8M, and 8N illustrate various embodiments of blocks 3600, 3700, 3800 having precision locating features disposed on respective top surfaces 3643*a*, 3743*a*, 3843*a* of the blocks. For example, in FIG. 8L, the precision locating features 3622 include a plurality or grid of off-center protrusions 3622 having an L-shape. The arrangement of these features can allow high pressure to be maintained between faces. The illustrated configuration provides a contact force in a particular direction based on the orientation of the blocks. FIG. 8M also illustrates precision locating protrusions 3722, but the protrusions are cylindrical in shape instead of L-shaped. A person skilled in the art will recognize such protrusions, or precision locating features more generally, can have virtually any shape and size depending, at least in part, on the configurations of the other components with which they are being used. FIG. 8N provides for an alternate precision locating feature, namely precision locating bores 3822 extending into a top surface rather than protrusions extending out of the top surface. As shown, the precision locating bores 3822 can be L-shaped, like the protrusions of FIG. 8L, although any other shape is possible. Complementary mating features, such as similarly-shaped protrusions, can be used in conjunction with the precision locating bores. In some embodiments, like the block 3700 provided in FIG. 8M, particular features can be configured to mate with multiple types of complementary mating features. Accordingly, for example, the protrusions 3722 can fit with the protrusions 3622 and the bores 3822. This configuration in both instances, in turn, can provide for high pressure to be maintained between the respective faces because the off-center forces can push the blocks together into a side-by-side configuration.

FIGS. 8O-8Q illustrate another exemplary embodiment of a type of modular block 3900, described herein as a stepped block. As shown, the block 3900 can include a plurality of steps 3922, 3924 (e.g., two in the illustrated embodiment), the stepped block including a first mating surface 3906, a second mating surface 3908, and first and second surfaces that are adjacent and substantially perpendicular to the first and second mating surfaces 3906, 3908, respectively. In the illustrated embodiment as depicted in FIGS. 8O and 8P, the first mating surface 3906 faces upwards, the second mating surface faces downwards 3908, the first surface adjacent and substantially perpendicular to the first mating surface 3906 faces to the left, thus facing towards the first mating surface 3906, and the second surface adjacent and substantially perpendicular to the second mating surface 3908 faces to the right, thus facing towards the second mating surface 3908. Further, the first and second mating surfaces 3906, 3908 can include thereon one or more precision locating features 3922, 3924. In the illustrated embodiments, the first and second mating surfaces 3906, 3908 include a plurality of walls 3922 and channels 3924 configured to receive complementary walls 3922 and channels 3924 (sometimes referred to as ridges) of other modular blocks 3900, such as other stepped blocks. The precision locating features 3922 can operate in a manner similar to those described throughout the present application. FIG. 8Q illustrates a configuration in which three stepped blocks 3900 are mated together. As shown in that figure, a microchannel 3942 can be formed through a volume of each of the stepped blocks to form a microfluidic path. Alternatively, or additionally, microchannels 3942 can be formed in outer surfaces of the blocks 3900 to provide one or more microfluidic paths, as provided for in other embodiments described in the present disclosure.

FIG. 8R illustrates another embodiment of a stepped modular block 4000, with a length of the block being significantly longer than the one described above with respect to FIGS. 8O-8Q, thus providing for more ridges 4024 on a first mating surface 4006. This embodiment also illustrates an additional modular block 4100, referred to herein as a tree-like block, that can be used in conjunction with the stepped block 4000. As shown, the tree-like block 4100 includes one or more protrusions or posts 4122 (as shown four), that can be configured to be removably and replaceably coupled to the ridges 4024 of the first mating surface 4006. The tree-like blocks can have virtually any configuration that is mateable to precision locating features 4022 of stepped blocks 400 (or any other type of modular block), and thus the illustrated configuration is by no way limiting.

In some embodiments, such as the one provided for in FIG. 8S, a plurality of tree-like blocks 4100 can be coupled to one or more stepped blocks 4000, and then one or more microchannels 4142 can be formed on, in, and/or through the tree-like blocks 4100 (and/or on, in, and/or through the stepped block(s)) to form one or more microfluidic paths. In the illustrated embodiment of FIG. 8S, there are two stepped blocks 4000 provided as a base, and four tree-like blocks 4100. Optionally, to provide a more secure system, stepped blocks 4000 can also be attached to a top portion of the tree-like blocks 4100, as shown in FIG. 8S. Like any of the embodiments provided for herein, one or more functional components, such as a sensor 4084, can be incorporated into the design to allow for various measurements of fluid that passes through the system. Many different types and configurations of sensors are provided for in the present disclosure, and, in view of the present disclosures, a person skilled in the art will recognize many different types of sensors not necessarily described herein that can be used in conjunction with the systems, devices, and methods provided. These sensors can include, by way of non-limiting examples, a light sensor, optical elements (e.g., lens, prism), and a pH sensor. Blocks including sensors and the like can be referred to herein as active and/or sensing blocks or bricks. Other examples of active and/or sensing blocks can include photodiodes and charge-coupled devices, which are discussed in greater detail below.

The modular blocks described above can be integrated into various systems. Systems of the present disclosure can include a plurality of blocks configured to provide one or more sealed microfluidic paths or microchannels. The microchannels can be configured in a variety of ways, including channels that can separate fluids or components within a fluid, combine fluid via channels that include a Y, T, or X geometry), and/or meander to provide mixing, residence time, and/or provide wells or reservoirs. The blocks can be configured to provide one or more passages (e.g., inlet(s) and/or outlet(s)). In some embodiments, the passage(s) of one block can be configured to mate with the passage(s) of another block. In such embodiments, the mating passages can be located on opposing, i.e., facing, surfaces of the respective blocks. In other embodiments, the inlet and or outlet are configured to allow the addition of a fluid or removal of the fluid from the system. In such embodiments, the inlet or outlet can be located on the top of the block, such as near or within a single post, or a face orthogonal to a mating face.

FIGS. 9A-9C illustrate a block-based fluid manifold that can function to open a valve for fluid flow. As shown in FIG. 9A(1), a system can include a fluid that travels through a channel 4236 in a main baseplate 4230 being redirected into blocks 4200 that are placed on the main plate 4230. Redirection of the fluid can occur when the attachment of a block 4200 onto the baseplate 4230 would open a valve or otherwise allow fluid into the block 4100 from the baseplate 4230 or from other blocks 4210. The baseplate 4230 can include a series of blocks 4210 on springs 4286, as shown, that have fluid passing between them. A block 4200 placed onto the plate 4230 can displace a baseplate block 4210 mounted on springs 4186 by compressing the spring 4186, and can then connect to a fluid path in its place, as shown in FIG. 9A(2).

FIG. 9B provides for a configuration in which fluid flow through both a baseplate 4330 and a modular block 4300. As noted above, technically a baseplate can itself be considered a modular block. As shown, a baseplate 4330 includes a channel 4336 formed through it. In some such embodiments, an exemplary fluid block 4300 having an overhang 4312 can be used in conjunction with the baseplate 4330, for instance by placing it with respect to the baseplate 4330 in a manner in which the overhang 4312 contacts a portion of the fluid channel of the baseplate 4330. This contact can allow fluid to fill a notch and redirect the fluid to the main portion of the block 4300, maintaining a single flow path for fluid. The fluid can travel through the block 4300 along the path 4342, as shown in FIG. 9B once the baseplate 4330 and block 4300 are coupled together. Alternatively, as illustrated in FIG. 9C, the fluid can travel through the block 4400 in a path 4442 that is substantially perpendicular to the channel of the baseplate. In this embodiment, the precision locating features, e.g., the elastically averaged contacts, between the block and the baseplate secure their relative positions, and also facilitate transfer of fluid from one or more selected pathways in the baseplate to one or more pathways in the block. It will be appreciated that multiple blocks can be positioned on the baseplate to perform multiple operations. In an alternate embodiment, a block with a hole with an O-ring surrounding the hole can face-seal against a hole or channel in the baseplate.

Various microfluidic systems can include additional active or sensing block types, such as sensors (e.g., light, pH, etc.), lenses, cameras, light sources, prisms, mirrors, magnets, anodes, cathodes, electrical supply, springs, filters, heaters, thermocouples, piezoelectric transducers, valves, pumps, photodiodes, charge-coupled devices, microscopes and the like, to measure complex properties of fluid flow. Some non-limiting examples of those are provided above, and others below. By way of further non-limiting example, as shown in FIGS. 10A-10J, magnets and electrical current can be used to deform blocks and/or pathways or separate particles within the fluid. Electrical circuits can provide a means for separating components of the fluid, measure impedance or conductivity, and the like. An electrical circuit or electrical element can be held on or within a block and, for example, perform a function when the block is mounted onto or next to another block having electrical components or elements, and/or a circuit board.

FIG. 10A provides one embodiment of a baseplate 4530 having mounted to it a modular block 4500 that includes one or more electrical components 4513 (as shown, lights). The block 4500 is connected to a power source 4590 by one or more wires disposed on (and/or in) the baseplate 4530. While the illustrated power source is separate from the baseplate 4530, in other embodiments the power source 4590 can be mounted on the baseplate 4530 or on any modular block 4500 or the like of the system. Of course, additional components of a microfluidic system, including but not limited to one or more modular blocks having a microfluidic path associated therewith, can be used in conjunction with the components of FIG. 10A. The circuit board can be a printed circuit board with precision locating features, such as elastically averaging contacts, machined or otherwise disposed on the board.

FIGS. 10B-10E shows an embodiment for intersecting a fluid path with a circuit board 4530. The circuit board 4530 can include pins 4538 that can be inserted through grooves or holes (not shown) formed in a modular block 4500 that make electrical contact with parts of the fluid path. The holes in the modular block 4500 can be formed using any of the techniques provided for herein for forming microfluidic components as part of a modular block, or other techniques known to those skilled in the art. Alternatively, the holes can be pre-existing. These pins 4538 can also make contact with a conductive material, such as conductive ink, printed on a surface of the block 4500. The pins 4538 may fit in holes in the block such that electrical contact is made with the fluid, and/or an electric field is applied in the vicinity in the fluid. In some embodiments, the pins 4538 can be press-fitted or snap-fitted into the holes in the block 4500 such that fluid cannot penetrate between the pins and holes. In some embodiments, as shown, the block 4500 can have pins 4538 thereon that are configured to be received in holes of a circuit board to establish an electrical connect with the fluid. The pins 4538 on the block 4500 can be located on the same surface, or alternatively on a separate surface from the channel, to enable interchangeability of the block relative to the circuit board 4530.

The pins 4538 can be coated with an electrically insulating material, and/or a material chosen for chemical compatibility with the fluid that is conveyed through the brick path. The board 4530 may be a printed circuit board, or a flexible circuit board. In another embodiment, as shown in FIGS. 10F-10J, the block 4600 can interface with a circuit board 4630 or other electrical block via a chip 4692 having pins 4694 that is connected to the circuit board 4630 and can connect with one or more faces of the block 4600. It will be appreciated that one or more of the faces of the block can be configured to receive the pins 4694 of the chip 4692 therein such that the block 4600 can be rotated and inserted onto the circuit board in a variety of configuration. It will also be appreciated that the block 4600 can include a sensor 4684 thereon to allow for various measurements of fluid that passes through the system.

The illustrate embodiments that include some form of circuitry, electricity, or other electrical connection that provides an electrically conductive pathway, as well as those that can be derived from the present disclosure can generally be configured to allow voltage or current to be supplied to the system to power it for some purpose. In some embodiments, one or more electrically conductive pathways can contact a microfluidic path at one or more locations along the microfluidic path. For example, an electrically conductive pathway can be placed so that it will be in physical contact with a fluid that passes inside or otherwise through a microfluidic path. This can allow the electrically conductive pathway to be operative to sense one or more parameters of the fluid and/or to apply an electrical signal to the fluid. More generally, one or more electrically conductive pathways can contact one or more faces of a modular block having at least a portion of a fluid path formed in the and/or on the block. The electrically conductive pathway can be electrically connected to a printed circuit board, among other electrical components provided for herein or otherwise known to those skilled in the art.

FIGS. 11A-11H illustrate two embodiments in which an optical component is included as part of one or more modular blocks. Examples of optical components include a lens, camera, prism, and mirror, and such components can be a removable feature of a modular block(s), or can integral part of the structure of a block(s). FIGS. 11A-11F provide for a lens, while FIGS. 11G and 11H provide for a prism.

FIGS. 11A and 11B illustrate a modular block 4700 having an optical component 4752 that includes a lens, referred to herein as a lens block. The lens 4752 can aid optical inspection or excitation of the flow, e.g., by capturing an image, projection of an image, excitation with an LED/laser light source, etc. The lens 4752 can be monolithically connected to the block 4700 or placed in proximity to a block with a fluid pathway. In the illustrated embodiment, a base surface 4706 of the lens block 4700 includes one or more precision locating features 4722 (as shown in phantom, two posts), and a second surface 4708 that is adjacent and substantially perpendicular to the base surface can include the lens. The lens block 4700 can be mounted to another modular block, such as a modular block configured for advective mixing. An advective mixing block 1100, similar to the block discussed in FIG. 5E above, mounted to a baseplate is illustrated in FIG. 11C. As shown in FIGS. 11D and 11E, the lens block 4700 can be mated to one or more protrusions 1132 of the baseplate 1130, resulting in the configuration provided for in FIG. 11F.

A person skilled in the art will recognize that the lens, or other optical components, can be configured to perform a variety of functions. By way of non-limiting example, such a block can perform a function in an optical network that interacts with a fluid elsewhere via a second optical brick. In another embodiment, the lens 4752 can be filled with fluid from a connected fluid system, such that the pressure of fluid inside can alter the magnification of the lens 4752 by altering its shape, and such that light may be filtered by the contained fluid (e.g., by filling the lens with an infrared-absorbing fluid). It will be appreciated that the lens block 4700 can hold the lens 4752 as a separate object, such as with two blocks that have curved indents configured to hold a lens 4752 between them when they are placed in proximity with one another.

As shown in FIGS. 11G and 11H, another optical component that can be used in conjunction with a system, as shown the advective mixing block 1100, can include a prism or prism block 4800. The prism block 4800 can include a block with precision locating features 4822, e.g., elastically averaged contacts, and can include at least one prism. The prism can be associated with its block in a variety of ways, and in the illustrated embodiment it is monolithically connected to the block. As shown, the prism block 4800 can be removably and replaceably coupled to a modular block, e.g., the advective mixing block 1100, by engaging complementary precision locating features 1122. In the illustrated embodiment, a single protrusion 1122 of the advective mixing block 1100 mates with a reciprocal locating feature of the prism block 4800, although more features can be engaged, and other mating features, can be used in other embodiments. The prism block 4800 can be placed in proximity to a block with a fluid pathway, such that the prism serves to aid optical inspection or excitation of the flow, e.g., by reflection or separation of light, or by allowing optical access from another direction. The prism block 4800 may also perform a function in an optical network that interacts with a fluid elsewhere via a different optical brick. In another embodiment, the prism can be hollow and can be filled with fluid from the system, which can allow light to pass through the prism to be modified based on the refractive index and light absorption spectrum of the fluid inside. In some embodiments, a mirror brick can be included as an optical component having a reflective surface. It may also be mounted on a single post to allow rotation, and later permanently fixed in place to a brick with more posts after it is oriented to needs.

The use of various circuits, sensors, control systems, etc. can allow for the systems, devices, and methods provided for to be "smart," which is to say parameters of a fluid flow can be measured or otherwise detected and the system can be adapted accordingly. The various active functions provided for in the present disclosure (e.g., applying a magnetic field, applying an electric field, using a valve, heating, illumination, such as for a photo reaction, etc.) can be adjusted by a control system associated with any of the electrical components (e.g., circuit board, chip, sensors, etc.) to allow for smart responses. A flow of fluid can then be reconfigured as desired based on any feedback that exists in the system. The reconfiguration can be automated or manual and can involve operating specific features to change the flow of fluid and/or physically moving modular blocks and the like of a system.

While the present disclosure provides for benefits for using pre-existing modular blocks to form microfluidic systems, there can be beneficial aspects to using manufacturing techniques to produce modular blocks for use in microfluidic systems. For example, specifically designed blocks can be formed using various three-dimensional printing techniques provided for herein or otherwise known to those skilled in the art. One such specifically designed set of blocks is illustrated in FIGS. 12A-12D. In particular, FIGS. 12A and 12B provide two holding blocks 4900, 5000 configured to hold a smartphone so that a smartphone can be used as a functional block of the system, for instance to make various measurements of fluid flow. As shown in FIG. 12A, a first holding block 4900 can include a base 4930 having a plurality of precision locating protrusions 4932 formed on its top surface, a pillar 4954 extending away from the top surface, and a flag 4956, opposed to the pillar 4954 and also extending away from the top surface. The surfaces of the pillar 4954 and flag 4956 that face each other can be configured to allow for a smartphone 196 to be disposed therebetween without damaging the phone 196 in any significant way, if at all, as shown in FIG. 12C, and thus they can be smooth. FIG. 12B provides for a complementary second holding block 5000 that can be used to hold a second end of a phone. The second holding block 5000 includes a base 5030 having a plurality of precision locating protrusions 5032 formed on its top surfaces, a first pillar 5054 similarly configured as the pillar of the first holding block, and a second pillar 5058 that extends away from the top surface of the second holding block 5000 but is not as tall as the first pillar 5054 of the second holding block 5000. As shown in FIG. 12C, the second holding block 5000 is configured to help the phone be held up without necessarily securing its location by having it disposed between the two pillars 4900, 5000.

A certain level of tolerance can be built into the pillar and flag to allow for some flexibility to handle different size phones will still allowing the phone placed therein to be secured so that measurements taken by the phone are reliable. FIG. 12C helps to illustrate he flexible nature of the flat as it relates to having a phone 196 associated therewith. In some instances, optical components can be added to a phone for use, such as a lens attachment or a USB microscope may be used in place of the phone. The camera holder can enable the camera to be removed and reattached in the same place relative to the fluidic system. An embodiment of the holder can position the phone against three tall beams, and a stiff flag-like structure is pressed by the phone to deform its flag post, which can cause the structure to behave like a torsional spring and press the phone into place. Such a configuration can support high static loads that prevent fracture. While the flexibility of the flag allows for the ability to hold different phones, the spacing between components such as the pillars and flags can also be changed to accommodate other configurations. In some instances, the pillars and/or flags can be removably and replaceably coupled to the respective bases using precision locating features, allowing for further adjustability. Still further, a distance between the first holding block and the second holding block can also be adjusted to accommodate different phones. Alternate embodiments can reduce error by using a single-piece mount, strengthening the flag post, or forming the stand by another manufacturing method. FIG. 12D provides for an exemplary set-up of a microfluidic system having a plurality of modular blocks put together to form a microfluidic path and a phone 196, held by first and second holding blocks (not visible) adjacent to the modular blocks so the phone 196 can be used to perform one or more measurements on fluid flowing through the path.

FIGS. 13A-13D illustrates a system that includes one or more sensors 5184 that monitor flow through the system. The system can include a light sensor 5184 and emitter 5194 placed on a standard modular block 5100. As shown, the light emitter 5198 and paired sensor 5184 can be placed in line with one another on opposite sides of a fluidic block 5100 with the fluid channel 5142 in line with the sensor pair, though it will be appreciated that alternate configurations in which the emitter 5198 and sensor 5184 are on the same side of a block are possible. The block 5100 can have an opening milled therein to provide direct optical access through the block wall. It will be appreciated that a large-diameter fiber optic cable can be used as an emitting light source, as fiber optic cables are similar in design to many laboratory light sources.

It will be appreciated that in some embodiments, the light sensor can include a photodiode. In alternate embodiments, a functional block can position a charge-coupled device (CCD) relative to the channel in a block in order to image the fluid inside. Images of the imaged fluid can then be used to measure properties of the flow in order to record and visualize the fluid behavior, and/or provide for feedback control of the system.

FIGS. 14A and 14B, in combination with FIGS. 6O and 6P, illustrate a magnetic modular block 2600 in conjunction with a system (FIG. 14B) that includes one or more magnets to create elastically averaged contacts between adjacent blocks. This system can perform magnetic sorting, which is common in separation and processing of colloidal materials, including cells. For example, paramagnetic beads may be functionalized with a biologic material, such as biotin, which can bond to another marker attached to cells. Using magnetic forces to separate particles in the flow, the cells attached to paramagnetic particles can be captured, removed from the paramagnetic beads (such as via solvent exchange) and further analyzed, for example by a molecular assay. To that end, a passive sorting device that uses a permanent neodymium magnet mounted in a block to selectively sort suspended paramagnetic particles into one of two outlets can be used for sampling.

The process of magnetic sorting can include a plurality of magnetic blocks. One exemplary embodiment of a magnetic block 2600 for this use was discussed previously in FIGS. 6O and 6P. FIG. 14A provides a partially deconstructed view of the block 2600. As shown in FIG. 14A, each magnet 2682 can be part of its own magnetic sub-block disposed within a volume of the block 2600, with each sub-block providing three magnets of the six faces—one magnet per face. FIG. 14A illustrates one full sub-block, and has four additional faces of sub-blocks visible. In practice with respect to the illustrated embodiment, there are eight full sub-blocks disposed within the volume of the cube, with each sub-block providing three magnets of the six faces, leading to 24 magnets across the six faces.

FIG. 14B provides for a system of magnetic blocks used to sort fluid into multiple channels. As shown, the magnetic blocks can be moved, and magnets associated therewith controlled, to guide fluid through different fluid paths. In the illustrated embodiment, fluid enters the inlet 2644*a,* and progresses through an incubation chamber 2655, a splitting section 2657, and through two second outlets 2644*b* of the system connected to tubing. The blocks 2600 can be positioned and held together by magnets 2682, and the magnets may be conceived to also provide the impetus for magnetic material in the fluid to preferentially be directed towards one outlet rather than another. The blocks can be removed and moved to a new device for downstream analysis, or moved before the inlet in the same system and re-sorted. The ability to move blocks within the system can increase the purity or the capture rate of the final separated product. It will be appreciated that varying numbers of inlets 2644*a* and outlets 2644*b* can be used in the system. Alternate embodiments of the system can include a single device with two outputs 2644*b* that sorts the particles into multiple distinct segments, such as by shifting the magnet-holding block over by one post to sequentially increase the magnetic field. Alternatively, the magnets can be used to alter the flow rate and save captured solutions from one output and re-running the other. It will be appreciated that the ability to reposition the block can allow one having ordinary skill in the art to change the strength and direction of the magnetic field by discrete steps, and reliably move it back to the original position without additional hardware.

FIG. 15 illustrates a modular block 5200 for inertial sorting of particles, and FIGS. 16A and 16B provide a system for inertial sorting of particles that includes the modular block of FIG. 15. In inertial sorting, which is a variation of sorting discussed in FIG. 6I above, particles are sorted based on inertial effects in the fluid, which can typically be used to separate particles by size or density. An inertial sorter 5200, as shown in FIG. 15, can be connected to inlet block 5300 and outlet blocks 5400 which can then be connected to regular outlets, as shown in FIGS. 16A and 16B. As shown in FIG. 15, a central portion 5251 of the modular block 5200, also referred to herein as a sorting block or inertial sorter, includes a channel 5242 formed in a central portion of the block having a spiral shape or configuration, with a portion of the channel in an outer portion having a plurality of terminal ends 5242A, 5242B, 5242C disposed after the spiral shape. In the illustrated embodiment, there are three terminal ends, although fluid is only disposed in two of them by virtue of the configuration of the terminal ends and the fluid and its related parameters being sorted.

When fluid runs through the system, like the system of FIGS. 16A and 16B, the particles enter the sorter and separate into separate channels that lead to the outlet 5400 based on particle size. For example, an inlet block 1300' is provided in FIG. 16A for allowing a fluid to enter a fluidic path of the system. The inlet block 1300' includes an inlet aperture 1344*a*' and tube 1360' disposed above a top surface of the block where the top surface includes a plurality of precision locating protrusions 1322'. The inlet aperture 1344*a*' can be configured in any number of ways, including those provided for herein or otherwise known to those skilled in the art. The inlet block 1300' also includes a channel 1342' formed through a volume thereof, terminating at an outlet aperture 1344*b*' so fluid enters the inlet aperture 1344*a*' through the tube 1360', flows through the channel 1342' and out of the outlet aperture 1344*b'*.

The system also includes a passing block 5300 configured to be disposed adjacent to the inlet block 1300' to pass fluid from the inlet block 1300' to the sorting block 5200 of FIG. 15. As shown, the passing block 5300 has an inlet aperture 5344*a* configured to be in sealed, fluid communication with the outlet aperture 1344*b*' of the inlet block 1300'. The inlet aperture 5344*a* can feed to a channel 5342 formed in a first surface of the passing block 5300, which extends to a second surface of the passing block 5300, the second surface being adjacent and substantially perpendicular to the first surface. The channel 5342 terminates at an outlet aperture 5344*b* that is disposed near a center-top portion of the second surface. The outlet aperture 5344*b* can be configured to be in sealed, fluid communication with the a center portion of the spiral 5242 of the sorting block 5200. Still further, the system can include a receiving block 5400 configured to receive fluid from the terminal ends 5242A, 5242B of the path of the sorting block 5200. In the illustrated embodiment the receiving block 5400 includes two inlet apertures 5444*a* configured to be in sealed, fluid communication with the terminal ends of the fluidic path formed in the sorting block 5200. Each inlet aperture 5444*a* can feed to a channel 5442 formed in one or more surfaces of the block. A person skilled in the art will recognize the many various configurations individual blocks and full systems of this nature can have in view of the present disclosure without departing from the spirit of the present disclosure.

The inertial sorter 5200 can be milled to have varying dimensions, degrees of curvature, separate channels, and other parameters in order to regulate the separation of particles and the number of desired outlet streams. While increasing spiral efficiency and reducing the required planar area of the device is positive for performance, it may be advantageous to reorient the spiral sorter to be vertical. Such an orientation reduces the area of the device relative to the width of the block, and orients the inlets and outlets in a compact, stacked structure, even with a larger spiral. In the illustrated embodiment, the channel 5242 width is approximately 500 μm, though it will be appreciated that varying channel widths, including within a single embodiment of a sorting block and across multiple sorting blocks, can be used for sorting.

FIGS. 17A-17C illustrate a system for performing titrations of separate solutions. More particularly, FIG. 17A illustrates a flow chart or diagram of how some types of modular blocks provided for or derivable from the present disclosure can be used in a fluidic system. The diagram provides for two inlet blocks 1300", one for bases and one for acids, and a control block 5500 for each of the two inlets to pass the bases and acids into the water-flow system. The water flow system itself includes an inlet block 1300" and a control block 5500, and then a first combining block 1500 to allow the water to combine with the base. As shown, the combining block 1500 includes two branches 1542A, 154B, one for each of the base and the water, which then meet at a junction to enter a single path. A first mixing block 1700 can then be provided to mix the water and the base, before another combining block 1500 is used to combine the acid and the combined water-base fluid. A second mixing block 1700 can then mix the water-base fluid with the acid, with the combined fluid being passed near a sensor 1784 to sense one or more desired parameters to be determined, such as a standard pH sensor electrode sealed inside a block to provide a pH reading. The fluid can then be passed out of an outlet block 5400 if desired. During the process, the relative flow rates may be controlled by an external syringe pump, if available, or by altering the sizes of the "control" blocks shown and pushing flow from a single pressure source. It will be appreciated that several variations with numerous reagents and solutions are possible. Alternatively, a similar system can utilize a colorimeter, such as an Arduino-run colorimeter, which would measure the pH of the solution by color and intensity if an appropriate color-changing pH indicator is pre-mixed with one of the inputted fluids.

FIG. 18A shows a system that can use electrical contacts with water to induce transportation of fluid or material in the fluid by means of an electric field. As shown, a baseplate 5630 includes a first modular block 5600 and a second modular block 5610 coupled thereto, with the first and second blocks 5600, 5610 being opposed to, i.e., facing, each other and both having metal-coated faces or contacting metal films/plates 5612 on the opposed, facing surfaces. As shown, the first block 5600 can be a negative terminal and the second block 5610 can be a positive terminal. A gel 5614 or other material through which electricity can travel can be disposed between the two blocks as shown. As a result, an electric field can be created between the two blocks 5600, 5610. The gel 5614 can be loaded with a biological sample (e.g., DNA, protein, other material) at one end, which can travel through the gel 5614 to separate based on the relative size of molecules within the sample in response to the applied electricity, allowing characterization and further analysis. In other variations of the design, as shown in FIGS. 18B and 18C, a single modular block 5700 can include two metal contacts 5712 placed inside on a first end and a second end to create the positive and negative terminals. The contacts can include aluminum foil or another electrically conductive substance. The block can have an internal cavity that can be filled by a gel 5714 or another porous network. The block can be assembled onto a baseplate to make a sealed tank of gel. Once sealed, an electric field can be applied between the two metal contacts to cause separation or motion of the biological sample 5716. The separation in any such embodiments can be observed optically through the side of a transparent gel block, or the output fluid may be collected for further analysis. In any such embodiments, after a set period of time for separation, the separation blocks can be disconnected, with the result that a certain fraction of the sample material 5716 is within each of the blocks related to how far the components of the sample traveled.

It will be appreciated that in addition to gel electrophoresis systems, similar set-ups can be used for chromatography and fractionation of a sample. For example, mass fractionation can be performed by flowing a solution through a block with a stationary phase or adsorbent in the internal cavity, as in column chromatography. Fluid that is located at an output thereof can be removed at different times to generate different fractions. A size fractionation can be done by flowing fluid through blocks with filters having progressively smaller pore sizes.

FIG. 19 illustrate a hydroponic or aeroponic system where one or more modular blocks 5800 can be used to hold plants so a fluidic system can provide irrigation to the plants on a microfluidic scale. In the illustrated embodiment, a plurality of modular blocks 5800 are coupled together (as shown six outer blocks and two inner blocks having dirt for the plant disposed therein) to form the planter. A person skilled in the art will recognize that some modular blocks may have a configuration already suitable to have dirt disposed therein, while in other embodiments one or more blocks may need to be modified to allow for dirt to be disposed within the system. The plant is associated with the dirt. One or more channels 5842 can be formed in the modular blocks to provide an irrigation system to the dirt and plant. The channels 5842 can be formed in accordance with the various disclosures provided herein. Channels 5842 can have a cross-sectional area sufficient to deliver the desired amount of water to the dirt and plant. The channels 5842 can be formed through the volume of the block(s), or along a surface of the block(s). Materials that are used in such systems, such as ABS and polycarbonate plastic, as mentioned above, are biologically safe and can carry fluid at the milliliter or larger scales. Sensors 5884 similar to those described in the figures above can be integrated to monitor plant color, humidity, nitrates, and soil pH, and provide lighting and temperature control. In the illustrated embodiment, there is both a color sensor and a light sensor, and sensors for humidity, nitrates, and pH under the soil. As shown, the system includes a way for light L to be built into the set-up, including using modular blocks to hold the light. Likewise, the system can allow for air flow $A_F$ as shown. A full chamber can be built for the system, or it can be open-air.

Use of modular systems as pods can have numerous advantages. Modular systems can enable plants to be removed for examination, and then replaced in precisely the same location. Modular sensors and lights can be moved around and positioned in an exact position relative to plants. It will be appreciated that blocks with precision locating features like elastically averaged contacts can also be made using porous materials (e.g., clays, fibrous materials, engineered bioplastics), such that the blocks can be permeable to gas and liquid to provide the plants and soil with substances that promote plant growth.

FIG. 20 illustrates a system for culturing bacteria. The system can include a series of modular blocks that can perform a biological analysis, including one or more of dilution, mixing, separation, lysis, electroporation, incubation, sensing, and temperature control. In the illustrated embodiment, an inlet block 1300 is provided to allow for fluid to be added to the system, and then an incubation block 1800 and heater block 2500, which are disposed adjacent to each other, are provided to incubate the bacteria at a controlled temperature. During incubation, the culture can be monitored with a microscope M, and then a filter associated with a filtering block 2200 can concentrate the solution before removing the fluid, for instance via an outlet block 5400. It will be appreciated that the setup of the blocks, as with the other systems described above, is dynamic and can be changed, e.g., the heater block 2500 may be placed in another location in proximity to the incubation block 1800, the microscope M can be oriented at a different position with respect to the system, and so forth. Further, the culture block could be used for cells or bacteria. Additionally, a general culture block can be used to create a system with a plurality of cell types to create a laboratory model for a part of a biological organism, such as a human kidney or a plant leaf, including passage of fluid such as blood, air, or mucus, by tailoring the geometry and cell types within a plurality of blocks to simulate much of the native biological environment when they are combined together. In this case, multiple simulated sub-parts may also be combined to simulate a larger sub-part of a biological system. A person skilled in the art will recognize how various “organs-on-a-chip,” (a term understood by those skilled in the art) can be formulated in view of the present disclosures. In particular the present disclosures allow different parts of an organ to be put together and/or allows multiple organs to be used in the same system “on a chip.” In fact, the present disclosures generally allow systems that are modeled to be very three-dimensional, as opposed to planar or mostly-planar. Various blocks or bricks can have fairly intricate three-dimensional internal and cross-block pathways, just as do many operations in series.

FIGS. 21A-21C illustrate one exemplary embodiment of a biological system. The system can include a series of modular culture blocks 6000 that can be used to create a system that includes a plurality of cell types. As shown in FIG. 21A, each culture block 6000 can include a top block 6002, a bottom block 6004, and a middle block 6006.

In the illustrated embodiment, the bottom block can include protrusions 6022 that can be disposed within mating features 6024 of the top block 6002 to connect the culture block 6000, though it will be appreciated that the mating features can be located on the bottom block and the protrusions can be located on the top block instead. The middle block 6006 can include openings 6026 that run from a top surface 6015 of the middle block 6006 to the bottom surface of the (not shown) of the middle block 6006. The openings 6026 can align with the protrusions 6022 and the mating features 6024 of the top and bottom blocks 6002, 6004 to secure the block in a closed position. In the illustrated embodiment, the top block 6002 includes six mating features, the bottom block 6004 includes six protrusions, and the middle block includes six openings, though it will be appreciated that less than six or more than six of each can be used.

At least a part of a lower portion 6011 of the top block 6002 and a part of an upper portion 6013 of the bottom block 6004 can hold channels 6042 therein. The channels 6042, which can resemble a vascular network, lie disposed to contact the middle block 6006. The channels 6042 can have a variety of shapes and can be spread throughout the top and bottom blocks 6002, 6004, or be contained in a middle portion, as shown in FIG. 21B.

In the illustrated orientation, the channels 6042 can contact the middle block 6006, which can contain biologically relevant cells thereon 6016. The biologically relevant can include different types of organisms and biological matter, such as cells, bacteria, plant matter, and the like. It will be appreciated that a variety of architectures can be used to position the blocks so as to allow contact between multiple cell types, or position the biologically relevant cells relative to channels having different patterns. An exemplary embodiment of such channels having different patterns 6042' is shown in FIG. 21C.

In some embodiments, the system can be contained entirely within a single modular block that can connect to other blocks having the same or other biological systems. Multiple culture blocks 6000 can be assembled to create a system having a plurality of different cell types. In some embodiments, the system of culture blocks 6000 can create a model for a part of a biological organism, e.g., a human kidney or plant leaf, which includes passage of fluid such as blood, air, or mucus therethough. This "organ-on-a-chip" type of system can allow different parts of an organ, or different organs, to be positioned together. The geometry and cell types of the modular blocks 6000 can be tailored within a plurality of blocks to simulate much of the native biological environment when they are combined together. In such embodiments, multiple simulated sub-parts may be combined to simulate a larger sub-part of a biological system. It will be appreciated that the although the systems of culture blocks 6000 can be planar, or mostly-planar, orientations of the system having cross-brick pathways and three-dimensional internal pathways exist such that the system can perform many operations in series.

Although it has been indicated before, it bears repeating that the present disclosures allow for a plethora of different microfluidic systems and methods to be created, with the backbone being that pre-existing components can be individually tailored for various uses. Accordingly, the illustrated block types, configurations, shapes, and sizes, as well as the way they are combined to create different systems, paths, methods, uses, etc. are in no way limiting. A person skilled in the art, in view of the present disclosures, would understand how to apply the teachings of one embodiment to other embodiments either explicitly or implicitly provided for in the present disclosures. Further, a person skilled in the art will appreciate further features and advantages of the invention based on the above-described embodiments. Accordingly, the invention is not to be limited by what has been particularly shown and described, except as indicated by the appended claims. Additional details related to the present disclosure can be found in a thesis written by Crystal Owens entitled "Modular LEGO Brick Microfluidics," written and published at the Massachusetts Institute of Technology with a publication date of February 2017. All publications and references cited herein, including the aforementioned thesis, are expressly incorporated herein by reference in their entirety.

What is claimed is:

1. A microfluidic system, comprising:

a baseplate having a plurality of precision locating protrusions disposed thereon;

a plurality of blocks having a plurality of sidewalls, the plurality of sidewalls being configured to be complementary to the plurality of precision locating protrusions of the baseplate such that the plurality of sidewalls of a block of the plurality of blocks engage the plurality of precision locating protrusions of the baseplate to set a location of the block with respect to the baseplate;

one or more channels formed in one or more blocks of the plurality of blocks, the one or more channels of a first block of the plurality of blocks extending between a first passage of the first block and a second passage of the first block to form at least a portion of a microfluidic path; and one or more seals disposed along the microfluidic path.

2. The microfluidic system of claim 1, wherein the plurality of precision locating protrusions comprise a plurality of elastically averaged contacts, and wherein the plurality of sidewalls of the block comprise one or more elastically averaged contacts that couples with the plurality of elastically averaged contacts of the baseplate via an elastic fit.

3. The microfluidic system of claim 1, wherein the plurality of blocks further comprise one or more precision locating protrusions disposed thereon, the precision locating protrusions of the plurality of blocks being configured to be complementary to the sidewalls of one or more blocks of the plurality of blocks such that a second block of the plurality of blocks is coupled to the top surface of the first block that is coupled to the baseplate to set a location of the second block with respect to each of the first block and the baseplate.

4. The microfluidic system of claim 1, wherein the plurality of precision locating protrusions of the baseplate and the sidewalls of the plurality of blocks are configured to be reversibly coupled together such that a location that is set between the first block of the plurality of blocks and the baseplate is changeable.

5. The microfluidic system of claim 1, wherein the first passage is disposed on a first side surface of the first block and the second passage is disposed on a second side surface of the first block, the second side surface being opposed to the first side surface such that the microfluidic path extends from the first side surface to the second side surface.

6. The microfluidic system of claim 1, wherein the microfluidic path is substantially disposed along an outer surface of the first block.

7. The microfluidic system of claim 1, wherein the microfluidic path is substantially disposed through an internal volume of the first block.

8. The microfluidic system of claim 1, wherein at least one block of the plurality of blocks further comprises one or more precision locating posts extending towards the mating surface of the at least one block, the one or more precision locating posts being configured to be complementary to the plurality of precision locating protrusions of the baseplate such that coupling the one or more precision locating posts of the block to the plurality of precision locating protrusions of the baseplate assists in setting a location of the block with respect to the baseplate.

9. The microfluidic system of claim 1, wherein the one or more channels formed in one or more blocks of the plurality of blocks are formed in at least the first block and a second block, and wherein the one or more seals disposed along the microfluidic path further comprises:

a first seal disposed at the second passage of the first block;

a second seal disposed at a first passage of the second block, the first and second seals providing a sealed portion of the microfluidic path between the first and second blocks.

10. The microfluidic system of claim 1, wherein the plurality of blocks further comprises at least one block configured to perform a sensing function or an active function on fluid passing through the microfluidic path.

11. The microfluidic system of claim 9, wherein the at least one block configured to perform a sensing function or an active function on fluid passing through the microfluidic path comprises a block having at least one of a photodiode and a charge-coupled device associated therewith.

12. The microfluidic system of claim 1, wherein the first passage of the first block is formed on a first outer wall of the first block and the second passage of the first block is formed on a second outer wall of the first block, the first and second outer walls being adjacent and substantially perpendicular to each other such that the portion of the microfluidic path extending therebetween is formed in two, substantially perpendicular planes.

13. The microfluidic system of claim 1, wherein the plurality of blocks further comprises at least one block configured to receive a device configured to sense one or more parameters of a fluid passing through the microfluidic path.

14. The microfluidic system of claim 1, further comprising an electrically conductive pathway that contacts one or more faces of the plurality of blocks.

15. The microfluidic system of claim 14, further comprising a printed circuit board electrically connected to the electrically conductive pathway.

16. The microfluidic system of claim 1, further comprising an electrically conductive pathway that contacts the microfluidic pathway in one or more locations.

17. The microfluidic system of claim 1, wherein the one or more channels formed in the first block is configured to hold fluid therein by surface tension when the first block is repositioned or reoriented with respect to the baseplate.

18. A method for passing fluid through a microfluidic path, comprising:

attaching a first block to a baseplate by coupling sidewalls thereof to a plurality of precision locating protrusions disposed on the baseplate, the first block having one or more channels formed therein, the one or more microchannels extending between a first passage and a second passage;

attaching a second block to at least one of the baseplate or the first block, the second block being configured to do at least one of the following: (1) form an additional portion of a microfluidic path that includes a path defined by the one or more channels of the first block, the additional portion including one or more channels of the second block; and (2) perform a sensing function or an active function on fluid passing through the one or more channels of the first block;

placing fluid into the one or more channels of the first block by inserting the fluid into the first passage;

if the second block is configured to form an additional portion of a microfluidic path that includes a path defined by the one or more channels of the first block, allowing the fluid to pass from the second passage of the first block to a first passage of the second block such that the fluid enters the one or more channels of the second block; and if the second block is configured to perform a sensing function or an active function on fluid passing through the one or more channels of the first block, performing the sensing function or active function on the fluid placed into the one or more channels of the first block.

19. The method of claim 18, further comprising:

selectively attaching at least one of the second block if it forms an additional portion of a microfluidic path that includes a path defined by the one or more channels of the first block and one or more additional blocks to form a sealed microfluidic path between the first block and the selectively attached other blocks, wherein placing fluid into the one or more channels of the first block results in the fluid passing into at least one of the selectively attached other blocks.

20. The method of claim 19, further comprising moving at least one of the first block, the second block, and the one or more additional blocks after initial placement to change at least one of: (1) a configuration of the microfluidic fluid path; and (2) a location of a block of the second block and the one or more additional blocks that is configured to perform a sensing function or active function on the fluid placed into the one or more channels of the first block.

21. The method of claim 18, further comprising attaching a third block to a top surface of at least one of the first block and the second block by coupling sidewalls of the third block to a plurality of precision locating protrusions disposed on a top surface of at least one of the first and second blocks, the third block being configured to do at least one of the following: (1) form an additional portion of the microfluidic path that includes the path defined by the one or more channels of the first block, the additional portion including one or more channels of the third block; and (2) perform a sensing function or an active function on fluid passing through the microfluidic path.

22. The method of claim 18, further comprising forming the one or more channels of the first block.

23. The method of claim 22, wherein forming the one or more channels of the first block comprises forming at least a substantial portion of the one or more channels in an outer surface of the first block.

24. The method of claim 22, wherein forming the one or more channels of the first block comprises forming at least a substantial portion of the one or more channels through an internal volume of the first block.

25. The method of claim 18, wherein the one or more channels formed in the first block are formed in both a first outer wall and a second outer wall of the first block, the first and second outer wall being adjacent and substantially perpendicular to each other such that fluid passing therethrough is advectively mixed.

26. The method of claim 18, wherein the one or more channels formed in the first block have a spiral shape with a plurality of terminal ends, and placing fluid into the one or more channels of the first block by inserting the fluid into the first passage further comprises allowing the fluid inserted into the first passage to sort by dispersing to different portions of the one or more channels based on one or more properties of the fluid.

27. The method of claim 18, further comprising applying voltage to an electrically conductive pathway that contacts one or more faces of the first block.

28. A method for forming a microfluidic path, comprising:

forming one or more channels in a block having a plurality of sidewalls, the one or more channels being formed in one or more outer faces of the sidewalls of the block to create a microfluidic path in which fluid can be disposed;

coupling a cover to one or more of the outer faces in which the one or more channels are formed to cover the one or more channels, the cover being configured to maintain a location of fluid disposed in the one or more channels when the block is freely moved.

29. The method of claim 28, wherein the block is made by at least one of a molding process and a casting process, and wherein the one or more channels are made by at least one of a machining process or an additive manufacturing process onto a surface of the molded or casted block.

30. The method of claim 28, further comprising disposing a seal on at least at one of a first passage and a second passage of the portion of the microfluidic path formed in the block.

31. The method of claim 30, wherein the seal is disposed at the second passage, the method further comprising:

forming one or more channels in a second block having a plurality of sidewalls, the one or more channels being formed in one or more outer faces of the sidewalls of the second block to create a further portion of the microfluidic path in which fluid can be disposed;

disposing a seal at a first passage of the portion of the microfluidic path formed in the second block, the first passage of the second block being configured to be directly adjacent to the second passage of the block to keep the microfluidic path sealed between the block and the second block.

32. The method of claim 28, wherein the block further comprises one or more precision locating protrusions disposed thereon.

33. The method of claim 32, wherein the block further comprises one or more precision locating posts extending towards a bottom surface of the block, the one or more precision locating posts extending in a direction opposite to a direction in which the one or more precision locating protrusions extend.

34. The method of claim 28, wherein forming one or more channels in a block having a plurality of sidewalls further comprises:

forming a portion of at least one channel of the one or more channels in a first outer face of the one or more outer faces;

forming a further portion of the least one channel of the one or more channels in a second outer face of the one or more outer faces, the first and second outer faces being adjacent and substantially perpendicular to each other such that the at least one channel formed by the two portions of the first and second outer faces is formed in two, substantially perpendicular planes.

35. The method of claim 28, wherein forming one or more channels in a block having a plurality of sidewalls further comprises:

forming a portion of the microfluidic path near an edge between two outer faces that are adjacent and substantially perpendicular to each other such that the microfluidic path passes between the two faces multiple times along the microfluidic path.

* * * * *